United States Patent [19]

Turner et al.

[11] Patent Number: 4,855,954

[45] Date of Patent: Aug. 8, 1989

[54] IN-SYSTEM PROGRAMMABLE LOGIC DEVICE WITH FOUR DEDICATED TERMINALS

[75] Inventors: John E. Turner; David L. Rutledge, both of Beaverton; Roy D. Darling, Forest Grove, all of Oreg.

[73] Assignee: Lattice Semiconductor Corporation, Hillsboro, Oreg.

[21] Appl. No.: 262,493

[22] Filed: Oct. 25, 1988

Related U.S. Application Data

[60] Division of Ser. No. 862,815, May 13, 1986, which is a continuation-in-part of Ser. No. 707,662, Mar. 4, 1985, Pat. No. 4,761,768.

[51] Int. Cl.$^4$ .................... G11C 11/34; G11C 7/00
[52] U.S. Cl. ................................ 365/185; 365/233; 364/716
[58] Field of Search ............... 365/189, 185, 230, 233, 365/239, 240; 364/716; 307/465, 468; 340/825.83

[56] References Cited

U.S. PATENT DOCUMENTS 4,330,852  5/1982  Redwine et al. ............... 365/240 X
4,761,768  8/1988  Turner et al. ................... 364/716 X Primary Examiner—Joseph A. Popek
Attorney, Agent, or Firm—Marger & Johnson

[57] ABSTRACT

An in-system programmable logic device is disclosed which may be configured or reconfigured while installed in a user's system. The disclosed device employs non-volatile memory cells such as floating gate transistors as the programmable elements, and hence the device retain a particular programmed logic configuration virtually indefinitely during a powered-down state. The device is operable in a normal state and in several utility states for reconfiguring the device. The device state is controlled by an internal state machine which executes several state equations whose variables are the logic levels driving two dedicated pins and the present device state. One device pin receives serial input data which loads a shift register latch. The contents of the latch are employed to select a particular row of the cells to be programmed and the logic level to which the selected cells are to be programmed. The device normal inputs and outputs are isolated from the device during the utility states, so that the user's system does not affect the device operation during the utility states. A voltage multiplier circuit is included to generate the high voltage level necessary to program the floating gate transistors employed as the device memory cells from the device supply voltage, thereby further conserving on the required number of device pins. By programming a particular memory cell, the user may select the state of the device outputs during the utility states as either a present data latched condition or a tri-stated condition.

4 Claims, 22 Drawing Sheets

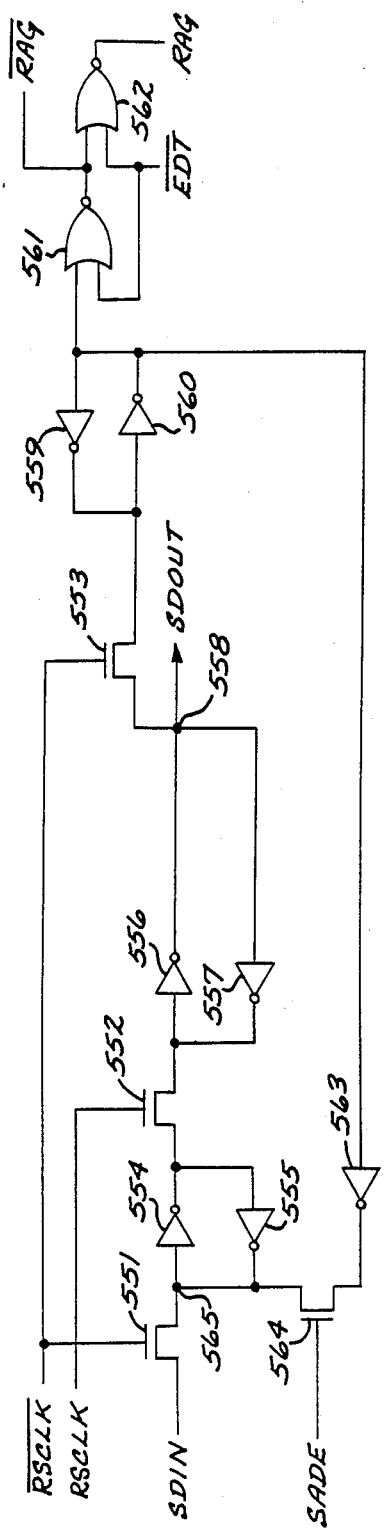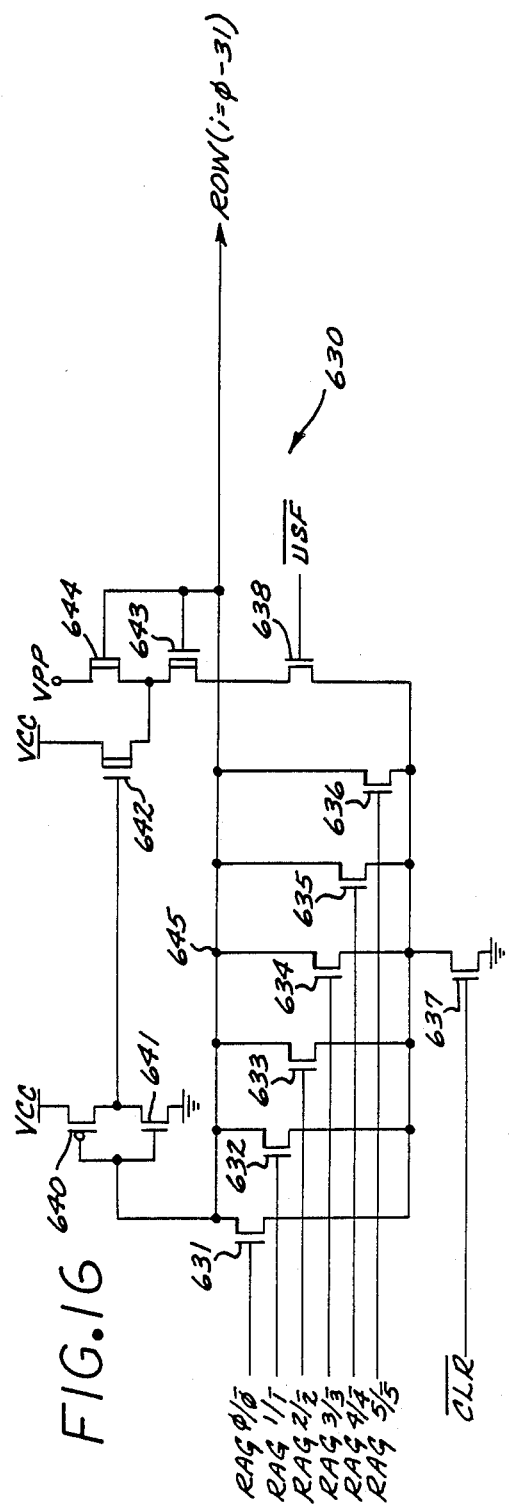
FIG. 15
FIG. 16

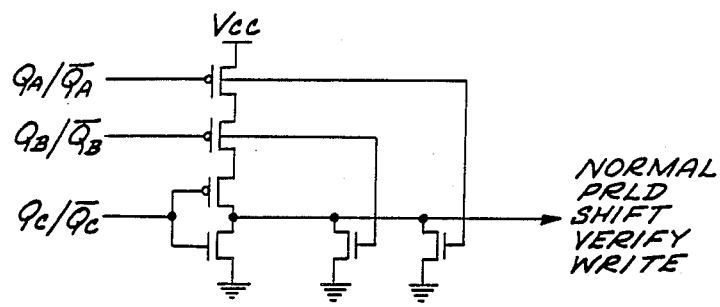
FIG.19
FIG.20
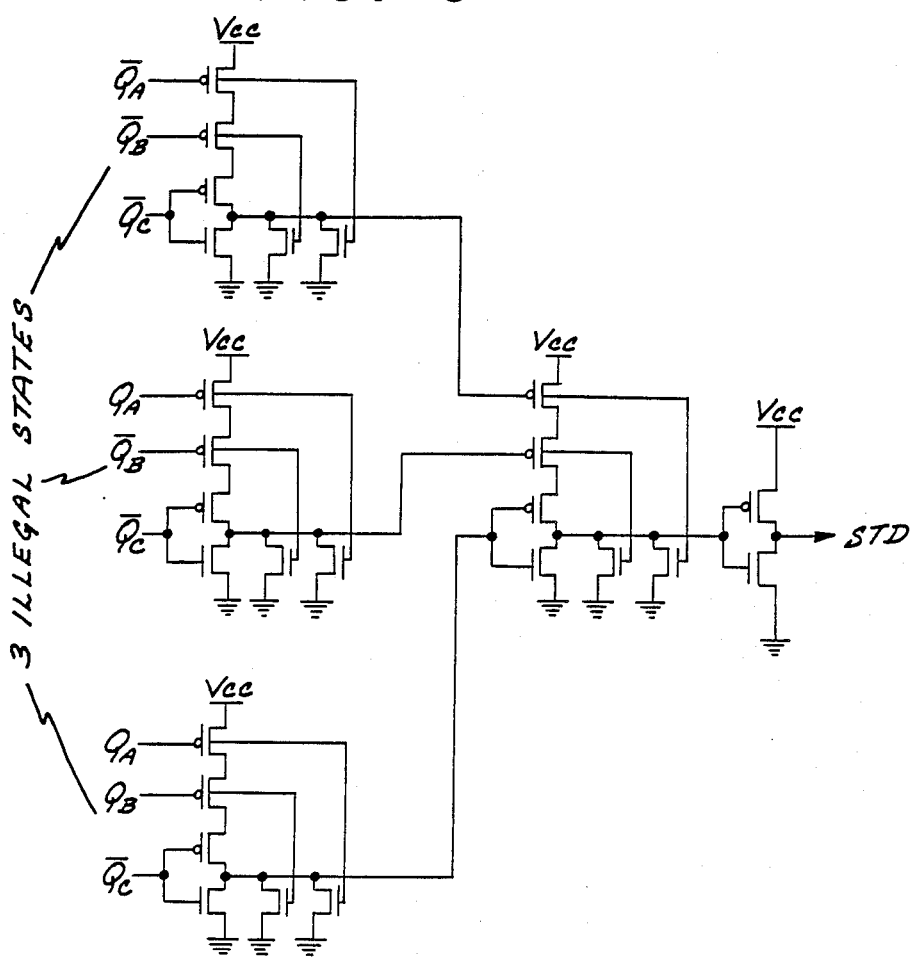

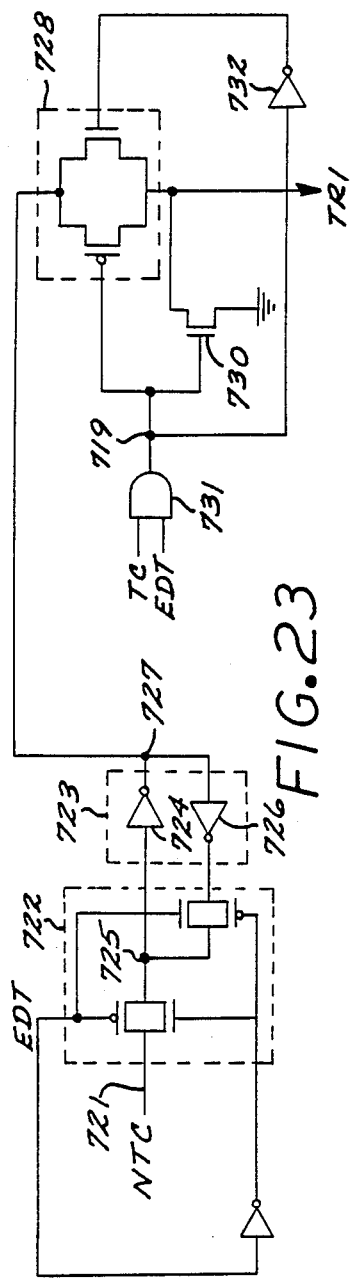
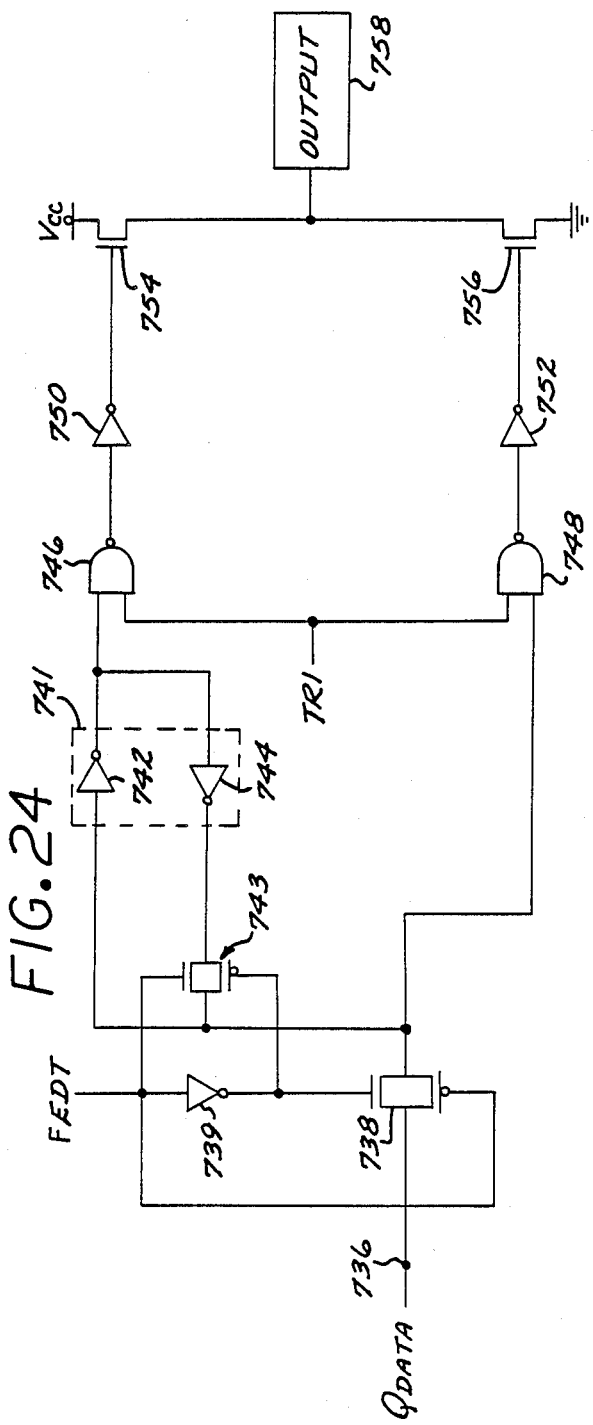
FIG. 23
FIG. 24

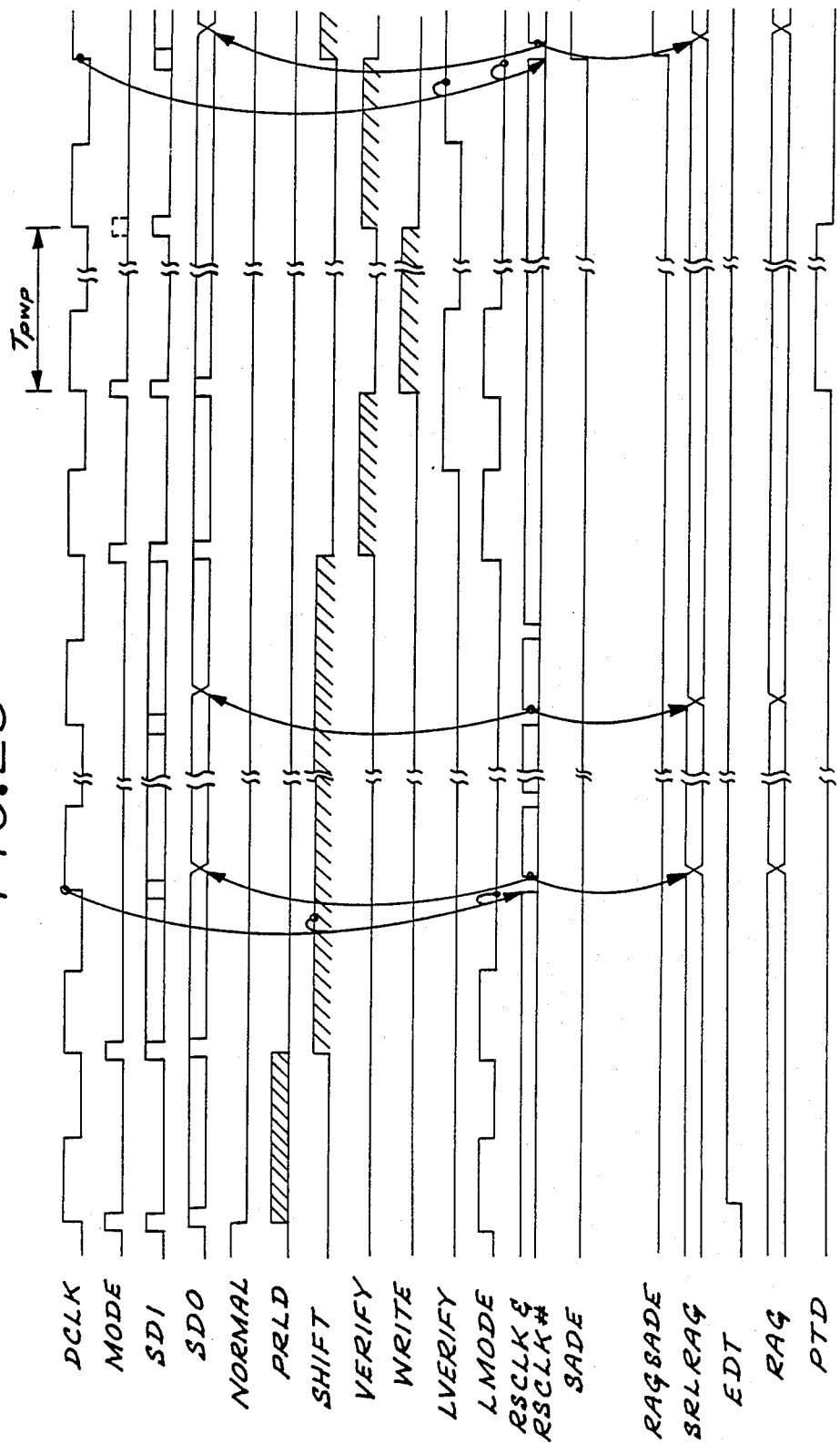

FIG.26A MODE

FIG.26B SDI — BIT0 / BIT1 / BIT2 / BIT3 / BIT4 / BIT5 / BIT6 / BIT7

FIG.26C SDO — HOLD SRL DATA / SDI — OLD REGISTER DATA — BIT0 / SDI / BIT0

FIG.26D DCLK

FIG.26E I/O — HOLD PRESENT STATE — VALID PRELOADED STATE

T1 — T2 — T3 — T4

FIG. 27A MODE
FIG. 27B SDI
FIG. 27C SDO
FIG. 27D DCLK

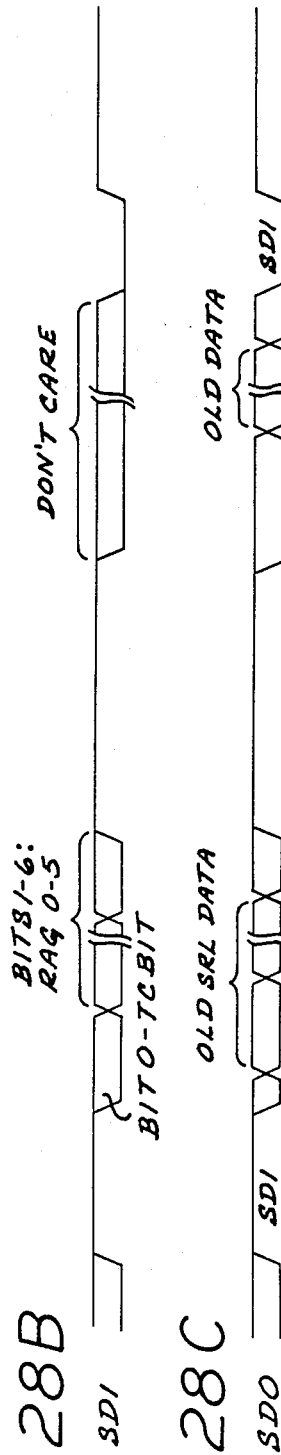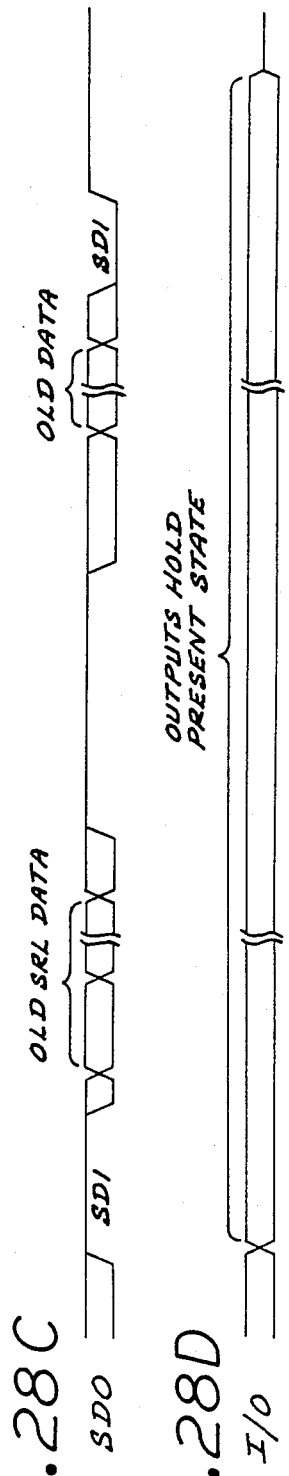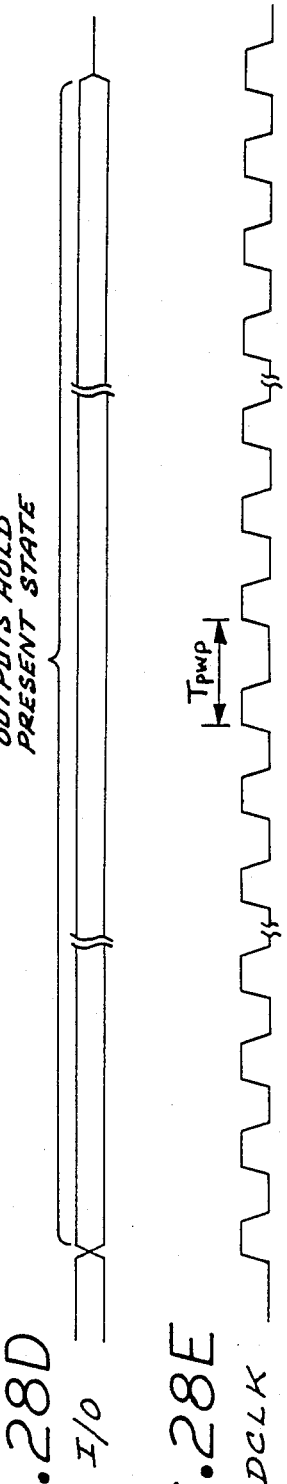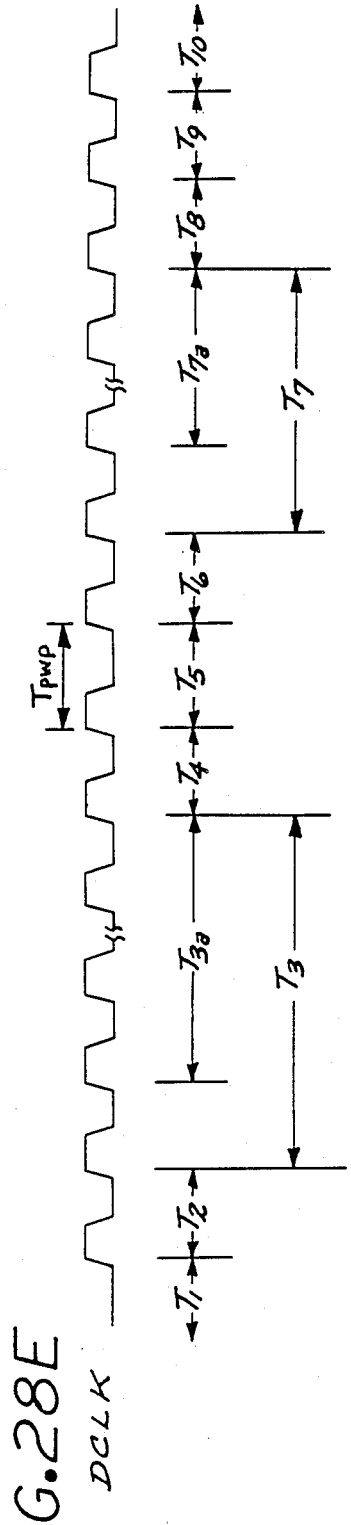

IN-SYSTEM PROGRAMMABLE LOGIC DEVICE WITH FOUR DEDICATED TERMINALS

This is a division of our copending patent application Ser. No. 862,815, filed May 13, 1986, for IN-SYSTEM PROGRAMMABLE DEVICE, which is a continuation in part of then copending patent application Ser. No. 707,662, filed Mar. 4, 1985, for PROGRAMMABLE LOGIC DEVICE, now U.S. Pat. No. 4,761,768, both having a common assignee with this application.

BACKGROUND OF THE INVENTION

The present invention relates to programmable logic devices, and more particularly to an improved programmable logic device employing electrically erasable memory cells and which may be programmed or reprogrammed while the device is installed in a user system.

Programmable logic devices (PLDs) provide a flexible logic function architecture, user-programmed through on-chip fuses or switches, to perform specific functions for a given application. PLDs can be purchased "off the shelf" like standard logic gates, but can be quickly custom tailored into a desired logic configuration.

To use PLDs, system designers draft equations describing how the hardware is to perform, and enter the equations into a PLD programming machine. The unprogrammed PLDs are inserted into the machine, which interprets the equations and provides appropriate signals to the device to blow the appropriate fuses or set the appropriate switches so that the PLD will perform the desired logic function in the user's system. The PLD typically includes thousands of the fuses or switches, arranged in a matrix to facilitate their manufacture and programming. Once programmed, the device is then removed from the programming machine and placed in its socket in the user's system to serve its final logic function. The programming and final logic functions are therefore separated, allowing the normal mode device pins to be multiplexed with programming mode functions to reduce or eliminate any pin overhead needed for programming the device.

While the PLDS on the market today enjoy substantial popularity with circuit designers, there are some applications in which it would be advantageous to have the capability to program the PLD while it is installed in the user's system, instead of only when in a programming machine.

Providing the ability to reconfigure a PLD "in-system" permits new applications for the devices that have not been possible before. One overhead for this flexibility is the addition of control pins necessary to reconfigure the device, since the normal device pins are occupied with their normal logic functions. Added pins result in added board space and less device packing per logic function.

It would therefore represent an advance in the art to provide a PLD which may be programmed in-system, and which employs non-volatile switch or memory elements to configure the device logic architecture.

It would further be advantageous to provide a PLD operable in a normal operating state and one or more utility states for reconfiguring the device, and wherein the device state is controlled by a state machine in dependence on external state control signals and the present state variables.

A further object of the invention is to provide an in-system PLD controlled by a state machine to minimize the number of required external pin connections needed for device reconfiguration.

Another object of the invention is to provide a PLD whose I/O pins can be isolated from the device AND and OR arrays during the utility states so that any signals driving these pins will not affect the device reconfiguration.

A further object of the invention is to provide a PLD whose outputs may be latched to a present valid data condition to preserve the output data during device configuration.

Yet another object of the invention is to provide a PLD whose outputs may be selectively latched to a valid data condition or tri-stated during a utility state.

A further object of the invention is to provide a PLD comprising electrically erasable and programmable cells and which includes on the device chip the circuit functions necessary for "in-system" programming of the cells.

SUMMARY OF THE INVENTION

A programmable logic device is disclosed which can be programmed while installed in a user's system. The device comprises a matrix of programmable switches arranged as rows and columns for selectively connecting an input line to a particular product term line. The switches comprise non-volatile memory cells such as floating gate transistors which may be programmed either to the conductive mode or the non-conductive mode to provide the desired switch state. The device is operable in a normal operating state and in several utility states allowing erasing, programming and verification functions to be carried out.

The device state is controlled by the external signals applied to three dedicated pins. The device comprises an internal state machine which controls the device state in dependence on the logic levels of a MODE signal and a "serial data in" (SDI) signal applied to respective device pins, as well as on the present state of the machine. In the preferred embodiment, the state machine comprises a programmable logic array programmed to execute a plurality of state equations which in combination with state registers determine the machine state. Thus, by driving the MODE and SDI pins in the appropriate manner, the device state may be changed from a present state to the next state in accordance with these external signals and the present device state, as determined by the state machine equations.

The device includes a data receiving means for receiving row selection data and row programming data through the external SDI pin. A multi-stage shift register latch (SRL) is connected to the SDI pin for receiving input data in a serial fashion. Predetermined ones of the respective stages of the SRL are coupled to respective ones of the product term lines, and predetermined other ones of the SRL stages are coupled to row decoders for the respective array rows. During the utility states, the normal device input drivers are tri-stated, i.e., placed in a high impedance condition, so that the signals driving these pins do not affect the device operation. During a programming state, data may be serially loaded into the SRL at a typical 100 KHz clock rate. With the SRL loaded with the row selection and programming data, during a subsequent programming state, the contents of the SRL associated with the row decoders are employed to select one array row, and the programming data is employed to program the respective memory cells in the selected row to the logic level corresponding to the programming data.

The device is provided with a means for generating the high programming voltage level necessary to program the floating gate transistors employed as the memory cell. The high voltage generating means comprises a voltage multiplier circuit for multiplying the supply voltage level to the necessary programming level.

Another aspect of the device is the provision of means for selecting the condition of the device outputs during a programming state. With the present invention, the user may select between a default condition wherein the outputs are latched to the last data condition during normal state operation, and a tri-stated condition wherein all the outputs are tri-stated. Upon transition from a utility state to the normal device operating state, the outputs assume their normal condition.

The invention provides an in-system programmable logic device which minimizes the number of required external pin connections for the programming states. The device employs non-volatile memory cells, and therefore remains in the programmed configuration even after device power-down.

BRIEF DESCRIPTION OF THE DRAWINGS

These and other features and advantages of the present invention will become more apparent from the following detailed description of exemplary embodiments thereof, as illustrated in the accompanying drawings, in which:

FIG. 15 is a simplified schematic diagram of one cell of the row address buffer of the shift register latch employed in the device of FIG. 12.

FIG. 16 is a schematic diagram of one row decoder comprising the device of FIG. 12.

FIG. 19 is a simplified schematic diagram of an exemplary legal state decoder employed in the device of FIG. 12.

FIG. 20 is a simplified schematic diagram of the illegal state decoder employed in the device of FIG. 12.

FIG. 23 is a simplified schematic diagram of the logic circuitry employed in the device of FIG. 12 for controlling the state of the output pins during programming.

FIG. 24 is a simplified schematic diagram of the output buffer employed in the device of FIG. 12 to provide control of the state of the output pins during the programming mode.

FIG. 25 is a timing diagram illustrating the signal waveforms of the control signals employed during the operation of the device of FIG. 12.

FIGS. 26A-26E are signal timing diagrams illustrative of a typical "Diagnostic: Register Preload" sequence.

FIGS. 27A-27D are signal timing diagrams illustrative of a typical programming sequence.

FIGS. 28A-28E are signal timing diagrams illustrative of a typical tri-state control bit programming sequence.

DETAILED DESCRIPTION OF THE PREFERRED EMBODIMENTS

The present invention comprises a novel programmable logic device employing electrically erasable, programmable memory cells, and adapted for high speed programming and verification. The following description is presented to enable any person skilled in the art to make and use the invention, and is provided in the context of a particular application and its requirements. In the following description, numerous specific details are set forth, such as circuit configurations, array cell circuits, signal timing diagrams and the like, in order to provide a thorough understanding of the invention. It will be obvious to one skilled in the art that the present invention may be practiced without these specific details. In other instances, well-known circuit details and steps are not described in detail so as not to obscure the invention.

FIRST EMBODIMENT - PROGRAMMABLE LOGIC DEVICE

Figure 1:
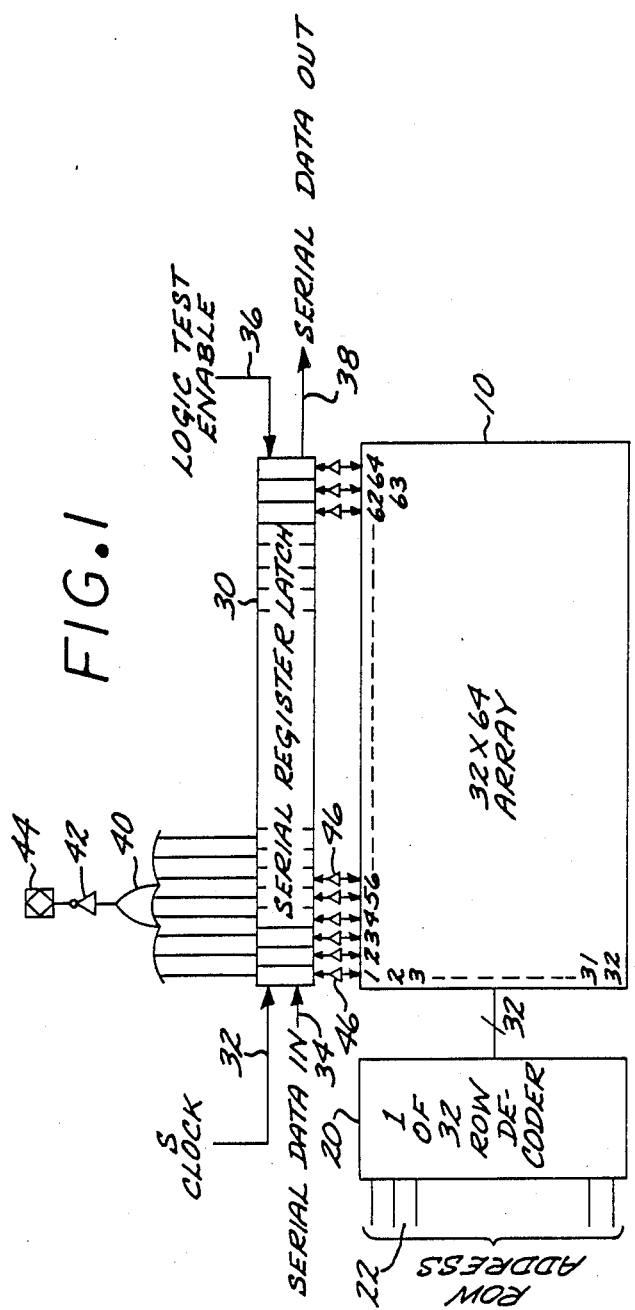
FIG. 1 is a simplified block diagram illustrative of the preferred embodiment.

Referring now to FIG. 1, a simplified block diagram illustrative of some of the principal features of a first embodiment of the invention is disclosed. Exemplary array 10 comprises a 32 row by 64 column (or product term) array of programmable cells. The cells are individually programmable, in dependence upon the state of a programming bit presented to the cell during a programming mode.

In accordance with the invention, a 64 stage serial shift register latch (SRL) 30 is coupled to the array 10, such that individual stages 1-64 of the SRL are respectively coupled to corresponding columns 1-64 of the array 10. A 1-of-32 row decoder 20 is provided to select a particular row of the array during the programming cycle.

The SRL 30 comprises a clock port 32, a serial data input port 34, a "logic test enable" port 36 and a serial data output port 38. The individual 64 stages of the SRL are respectively coupled to the respective 64 product terms of the array 10. The 32 row lines of the array 10 are respectively coupled to the output of the 1-of-32 row decoder 20. The address of the row to be programmed during a particular program cycle is selected by the state of the row address gate (RAG) bus 22.

The clock rate of the clock signal applied to the SRL is nominally 1 Mhz. Thus, programming data may be serially shifted into the SRL from a programming machine or test head external to the logic device at the clock rate; to load the SRL with 64 bits of data requires less than one millisecond at the 1 Mhz clock rate. Once the SRL is loaded with programming instructions or data, then the SRL contents are programmed into the 64 cells of the selected row of the array 10 during a nominal ten millisecond programming cycle. The programming process is then repeated for each row of array 10 until the entire array has been programmed.

The invention thus allows the programming of the array 10 to be performed very quickly; the entire 32 by 64 cell array may be programmed in less than one-half second, as compared with over 20 seconds required for "single bit" programming of EPROM-based PLDs.

The preferred embodiment of the invention is implemented in CMOS technology, wherein the storage elements of each cell comprise electrically erasable programmable floating gate field effect transistors employing Fowler-Nordheim tunneling. The technique is extendable to any arbitrary number of columns, since these floating gate transistors require essentially zero current to program. Thus, programming time can be greatly reduced for PLDs employing the invention.

The invention provides the capability for high speed verification of the contents of the array 10. The SRL may be employed to verify the state of each of the array cells in a particular, selected row. This data is loaded into the SRL and can be serially shifted out of the SRL via the "serial data out" port 38. As will be apparent to those skilled in the art, the programming equipment may be readily adapted to compare the output data contents of the selected row with the desired data.

A further aspect of the invention is illustrated in FIG. 1. During a logic test mode, data is serially loaded into the SRL. Under the control of a special test input ("Logic test enable"), the data in the SRL is forced onto the sense amplifier inputs. This "apparent array pattern" is then sensed through the normal output logic and read out of the device output pin. Data can then be serially clocked out of the SRL and verified against the logical output that was received on the device output pins. This technique allows the output logic to be validated using the normal sense amplifiers without having to program the array pattern into the device. This is a very powerful feature, as it allows the manufacturer to test virtually 100% of the output logic circuitry for each chip.

Figure 2:
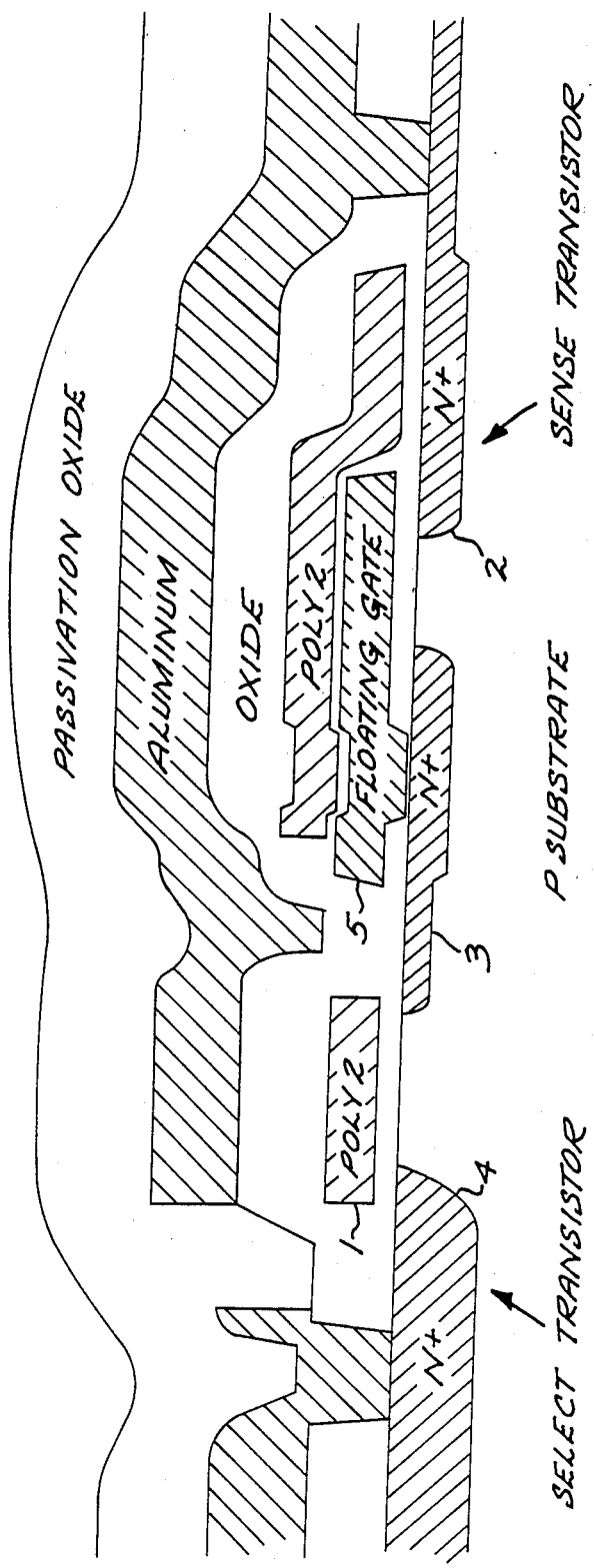
FIG. 2 is a simplified cross-sectional diagram illustrating the electrically erasable memory cell employed in the preferred embodiment in accordance with the invention.

FIG. 2 is a cross-sectional view of the electrically erasable memory cell employed in the preferred embodiment. The cell comprises a select transistor and a floating gate transistor as the sense or memory transistor. The floating gate device is adapted to employ the Fowler-Nordheim tunneling effect to remove or augment the charge stored on the floating gate to place the sense transistor in either the enhancement or depletion mode. To allow Fowler-Nordheim tunneling to take place, the floating gate region 5 is separated from the drain region, N+ region 3, by a very thin (100 Angstrom) layer of oxide.

The select transistor is formed by a polysilicon region 1, separated from the N+ regions 3,4 by an oxide layer. The polysilicon region 1 comprises the gate electrode of the select transistor, with the source and drain comprising the N+ regions 3,4 formed by N-type dopant implanted in the active area.

Programmable Logic Device - Normal Mode

Figure 3:
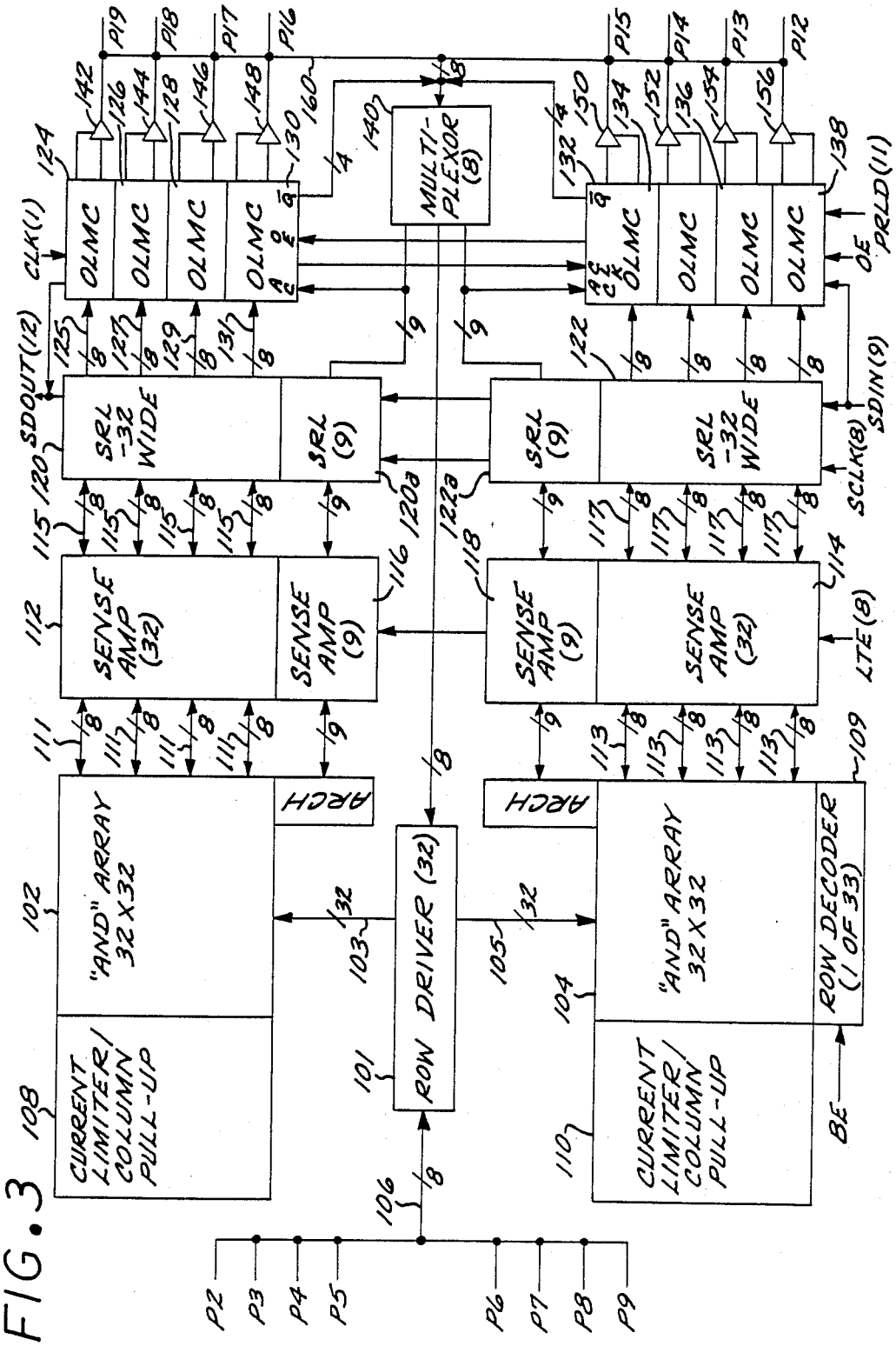
FIG. 3 is a block diagram of a programmable logic device employing the invention in its normal user mode.

Referring now to FIG. 3, a logic block diagram illustrative of a PLD employing the invention and in a normal user mode is disclosed. The preferred embodiment comprises an integrated circuit implemented in a CMOS technology. The physical layout of the circuit logic blocks of the PLD is generally indicated in FIG. 3. Thus, the 32 by 64 cell array of FIG. 1 is shown in FIG. 3 as two 32 by 32 subarrays 102, 104. To achieve higher performance, the AND gate array has been split into two halves with row drivers driving both directions. This effectively reduces by a factor of four the polysilicon row line delay.

Figure 4A:
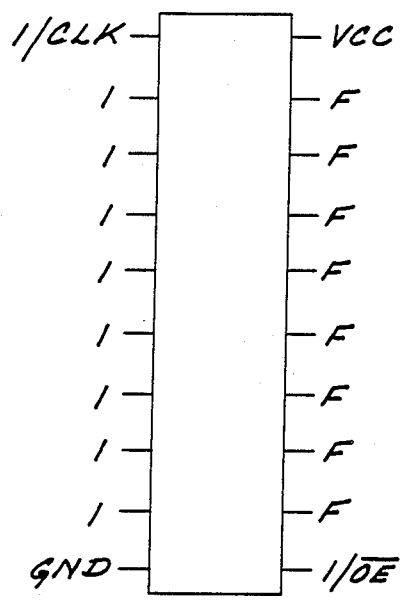
FIGS. 4(a), 4(b) and 4(c) depict, respectively, the functional pin layout of the 20 pin package employed with the PLD of the preferred embodiment in the normal mode, the edit mode, and the logic test mode.
Figure 4C:
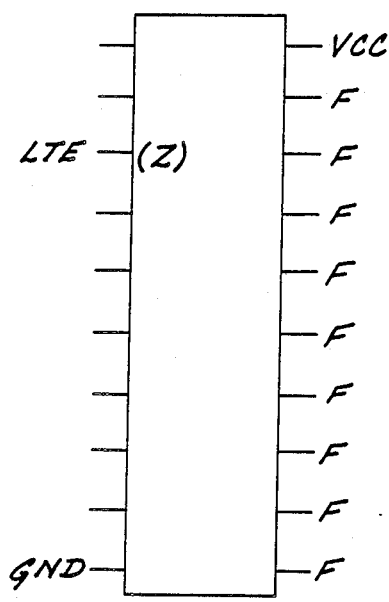
Figure 4B:
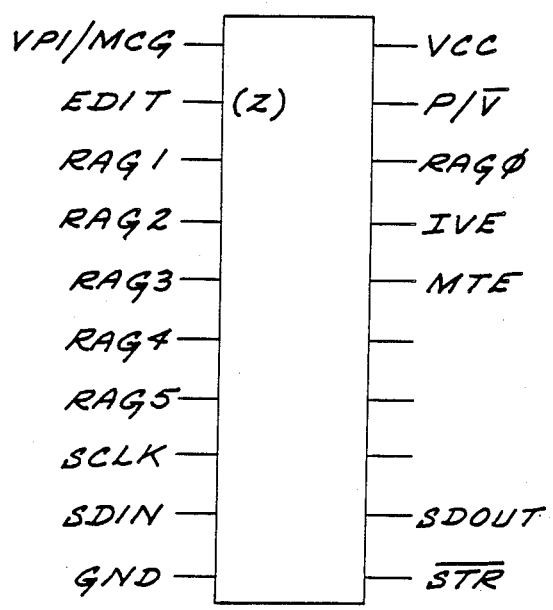

FIGS. 4(a), 4(b) and 4(c) illustrate the device functional pin layout of this embodiment in the normal mode (FIG. 4(a)) the edit mode (FIG. 4(b)) and the logic test mode (FIG. 4(c)). This embodiment is housed in a 20-pin package with eight dedicated inputs (P2-P9) and eight user-programmable bi-directional pins (P12-P19). Pins P1 and P11 provide clock and output enable (CLK/$\overline{OE}$) signals to the logic.

Figure 6:
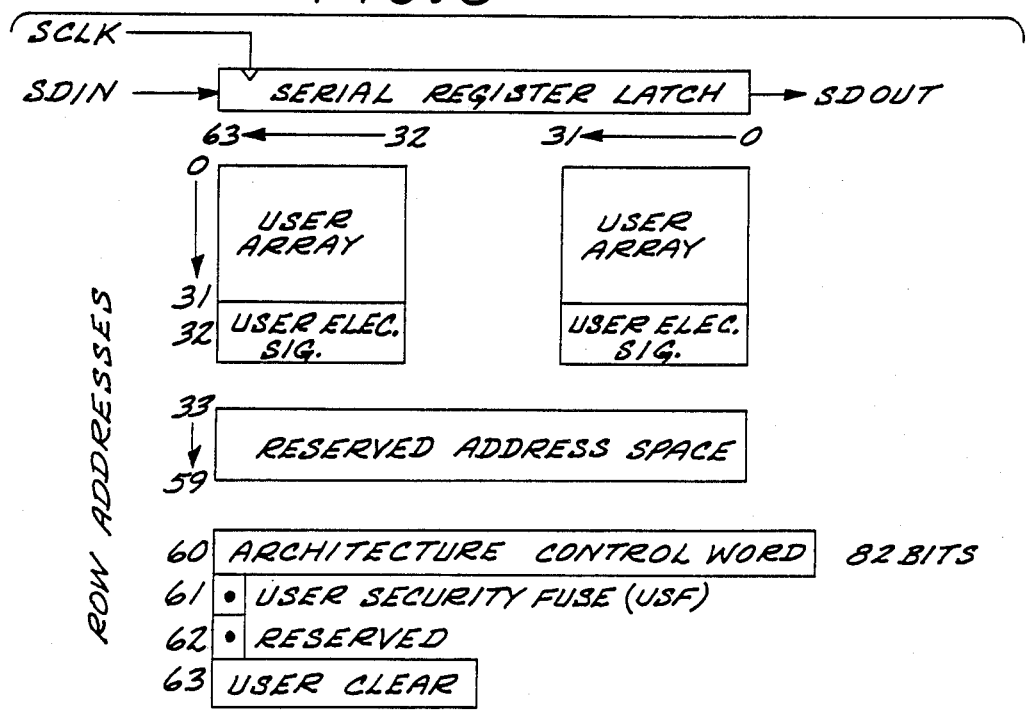
FIG. 6 is an illustration of the array configuration employed in the preferred embodiment.

While the size of the AND matrix available to the user for normal operation is 32 rows by 64 columns, the actual size of the matrix is larger to accommodate several other features of the device. Thus, FIG. 6 shows the actual array configuration employed in the preferred embodiment. Rows 0-32 comprise the user portion of the array. Rows 33-59 and 62 constitute reserved array space. Row 60 is 82 bits in length and defines the output logic architecture of the PLD.

During the normal user mode for this embodiment, pins P2-P9 are input ports and are coupled via bus 106 to row driver 101. In FIG. 3, the respective rows of arrays 102, 104 are coupled to the row driver 101 by busses 103, 105. One side of the respective columns of cells (or product terms) in the arrays is coupled to the current limiter and column pull-up circuits 108, 110. The other side of the array columns are coupled to sense amplifiers 112, 114 via busses 111, 113, respectively. The sense amplifiers 112, 114 are in turn coupled to 32 bit wide SRLs 120,122 via busses 115,117. To accommodate row 60 of the array which is 18 bits wider than the other rows of the array, 9 bit SRLs 120a,122a are selectively serially coupled to SRLs 120,122, and in a parallel fashion to sense amplifiers 116,118.

The SRLs 120,122 are in turn coupled to the output logic macrocells ("OLMC") 124,126,128,130,132,134,136,138. The respective OLMC outputs are coupled to respective output drivers 142,144,146,148,150,152,154,156. The 9 bit SRLs 120a,122a are coupled to multiplexer 140. Eight bit buss 160 couples the outputs of the output drivers to multiplexer 140, in turn coupled to the row driver 101. The output drivers are also coupled to output ports P12–P19.

Although not active during the normal user mode, the programming row decoder 109 is also illustrated in FIG. 3.

Figure 5:
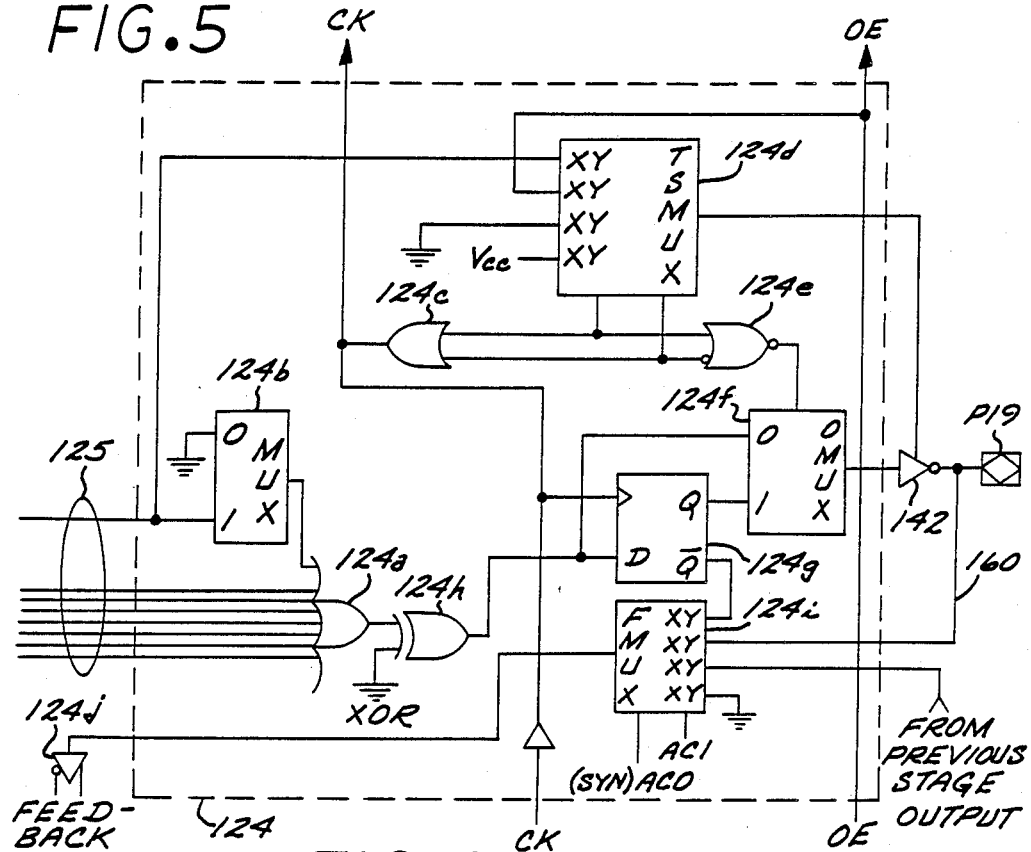
FIG. 5 is a simplified schematic drawing of an output logic macro cell as employed in the PLD.

FIG. 5 is a simplified schematic of a typical OLMC 124. In the normal user mode, eight bit buss 125 couples the outputs of eight sense amplifiers associated with eight product terms to the OLMC. The OLMC allows each device output signal to be individually set to active high or active low, with either combinational (asynchronous) or registered (synchronous) configurations. A common output enable ($\overline{OE}$) can be connected to all outputs, or separate inputs or product terms can be used to provide individual output enable controls.

The various configurations of the PLD are controlled by programming bits within the 82 bit architecture control word. Architecture control bit AC0 and the eight AC1 bits direct the outputs to be wired always on, always off (as an input), have a common $\overline{OE}$ term (pin 11), or to be three-state controlled separately from a product term. The architecture control bits also determine the source of the array feedback term through multiplexer 124i, and select through multiplexer 124f either combinational or registered outputs. The eight XOR bits determine individually each device output polarity. The OLMC operation will be apparent to those skilled in the art, and need not be described in additional detail.

The PLD illustrated in FIGS. 3 and 5 is employed in a normal user mode wherein data input/output to the device I/O ports is passed through the device logic paths and operated upon by the particular logic devices which are active, to obtain the desired logic operations on the input signals.

PLD AND Array

The AND gate array is implemented in a non-volatile reprogrammable EEPROM type technology, which replaces the bipolar type "fuse." The basic cell of the user AND array comprises two transistors, the select and sense transistors; the cell is repeated 2048 times to make up the user programmable "AND" matrix organized as 32 input lines and 64 product terms.

Figure 7:
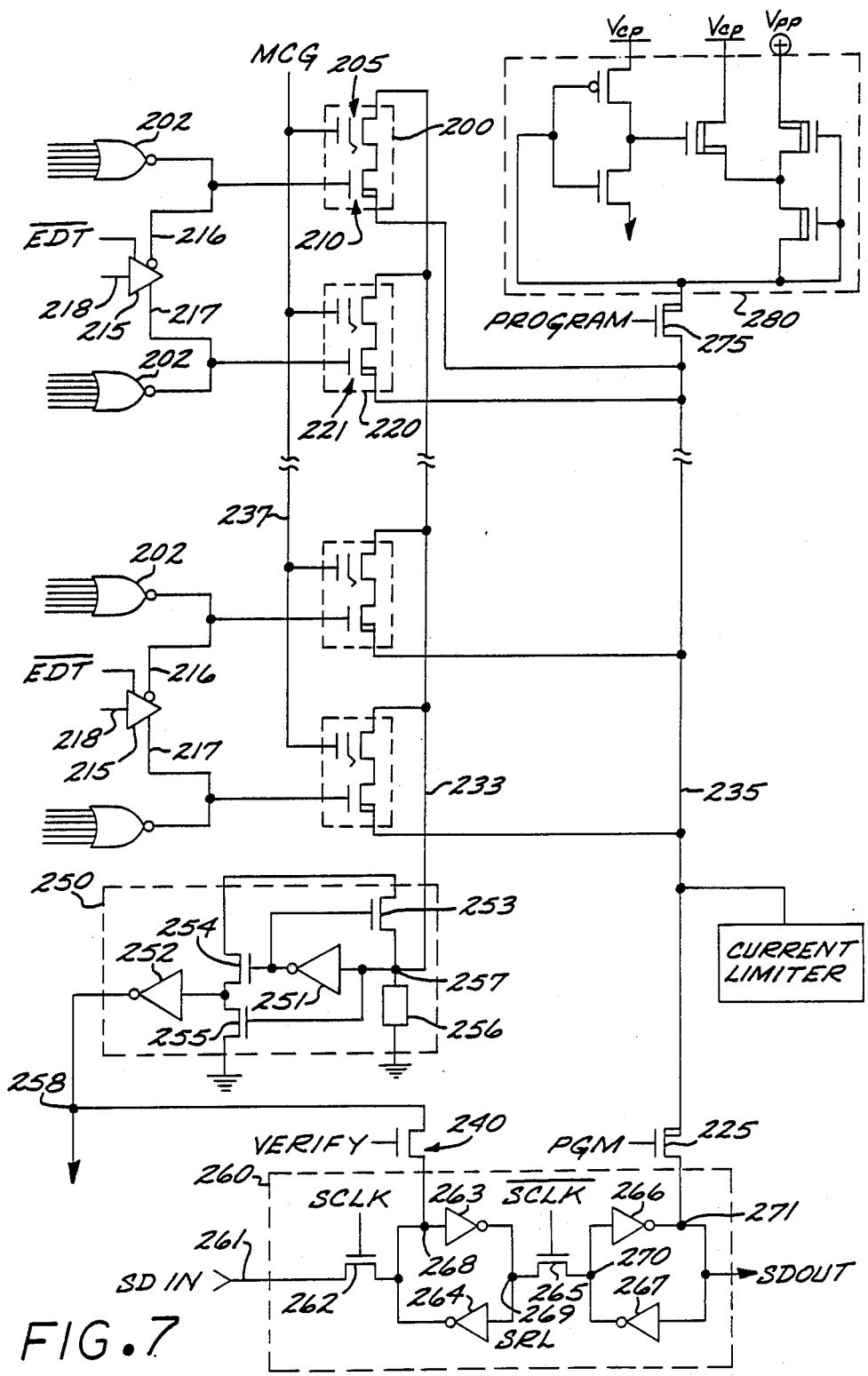
FIG. 7 is a simplified schematic illustrative of four cells of a product term or column of the AND array and programming and verification circuits of the preferred embodiment.

Referring now to FIG. 7, a simplified schematic of four cells of a product term comprising the subarrays 102,104 is disclosed. Line 233 comprises one of 64 product terms, and line 235 the product term ground line for the product term 233. During the normal user mode, line 235 is the grounded side of the device.

In the preferred embodiment, each product term comprises 32 cells coupled in parallel between the product term 233 and the product term ground line 235. Transistors 205,210 comprise one cell 200 coupled to product term 233. Transistor 210 comprises the "select" transistor or gate of the cell. In the normal user mode, the respective select transistors are gated by the input data, and selectively couple the respective sense transistor to the product term ground line. Input driver 215, for example, is gated by an input signal 218, and its true and compliment row driver signals on lines 217,216, respectively, drive the gates of select transistors 221,210. Thus, for example, if the input signal on line 218 is high, select transistor 221 will be turned on and select transistor 210 will be turned off.

In the device edit mode for this embodiment, the function of the "select" gates in a product term is to isolate predetermined ones of the sense transistors from the high programming voltage. For example, during the edit mode, only one of the 32 cells in a column is to be selected at any given time (except for "bulk" erasing or programming described below, in which the entire array is set to the same state). The selection is accomplished by row decoders 202, one of which is coupled to the gate of each select transistor of each cell. Pins 3–7 and 18 comprise the inputs to the row decoders, and select 1 of the 32 rows to be edited during a particular edit cycle.

The second transistor in each cell comprises the data storage (or sense) element for the cell. The transistor comprises an electrically erasable floating gate field effect transistor. The gate threshold turn-on voltage is about +8 volts when the device is in the enhancement mode, and about −5 volts when the device is in the depletion mode. Thus, for cell 200 shown in FIG. 7, during normal user operation, with a nominal interrogation voltage (+2.5 volts) on the matrix control gate ("MCG"), the floating gate transistor 205 will conduct when it has been programmed to the depletion mode; when the transistor is operating in the enhancement mode it does not conduct. Thus, during the normal user mode of the PLDs, the state of the sense transistors for each cell determines whether the corresponding input line for that row is coupled to the product term.

During the PLD edit mode, the input drivers 215 are disconnected from the array (by switches not shown) by the $\overline{EDT}$ signal and the row decoders are enabled. On the other hand, during normal PLD operation the row decoders 220 are disabled and have no effect on device operation.

The product term 233 is coupled to the input of sense amplifier 250. Amplifier 250 comprises inverters 251,252 and transistors 253–255. Load 256 provides a dc leakage path for the input node 257 of the sense amplifier to ground.

The output 258 of sense amplifier 250 is coupled to node 268 of SRL stage 260 by transistor 240, which is gated to the conductive state by the "VERIFY" signal. The product term ground line 235 is coupled to node 271 of SRL stage 260 by transistor 225, which is gated to the conductive state by the "PGM" signal.

The SRL stage 260 comprises inverters 263,264,266,267, and transistors 262,265 which are gated to the conductive state by the clock signal "SCLK" and inverted clock signal "$\overline{SCLK}$". Thus, data at the input 261 to the stage 260 will be inverted and propagated to node 269 when SCLK is high; $\overline{SCLK}$ is low during this time, and transistor 265 is nonconductive. When SCLK goes low, transistor 262 is turned off and $\overline{SCKL}$ goes high, turning on transistor 265. The input of the stage 260 is then isolated, and the inverted data is propagated through and inverted by inverter 266, so that the data present at node 261 during the clock signal is present at the output node 271. The data is latched at this node, through the operation of inverter 267, so long as transistor 262 is nonconductive. Shift register latches are known in the art; an exemplary reference is the paper entitled "A Survey of Design for Testability Scan Techniques," by E.J. McCluskey, in VLSI Design, Dec., 1984.

The product term ground line 235 is also coupled to the column pull-up circuit 280 by transistor 275, which is gated to the conductive state by the "PROGRAM" signal. The pull-up circuit 280 is a high impedance voltage source adapted to generate a programming voltage (nominally +20 volts) high enough to program the floating gate transistors comprising the matrix cells. Such pull-up circuits are known in the art.

PLD Device Edit Mode

Figure 8:
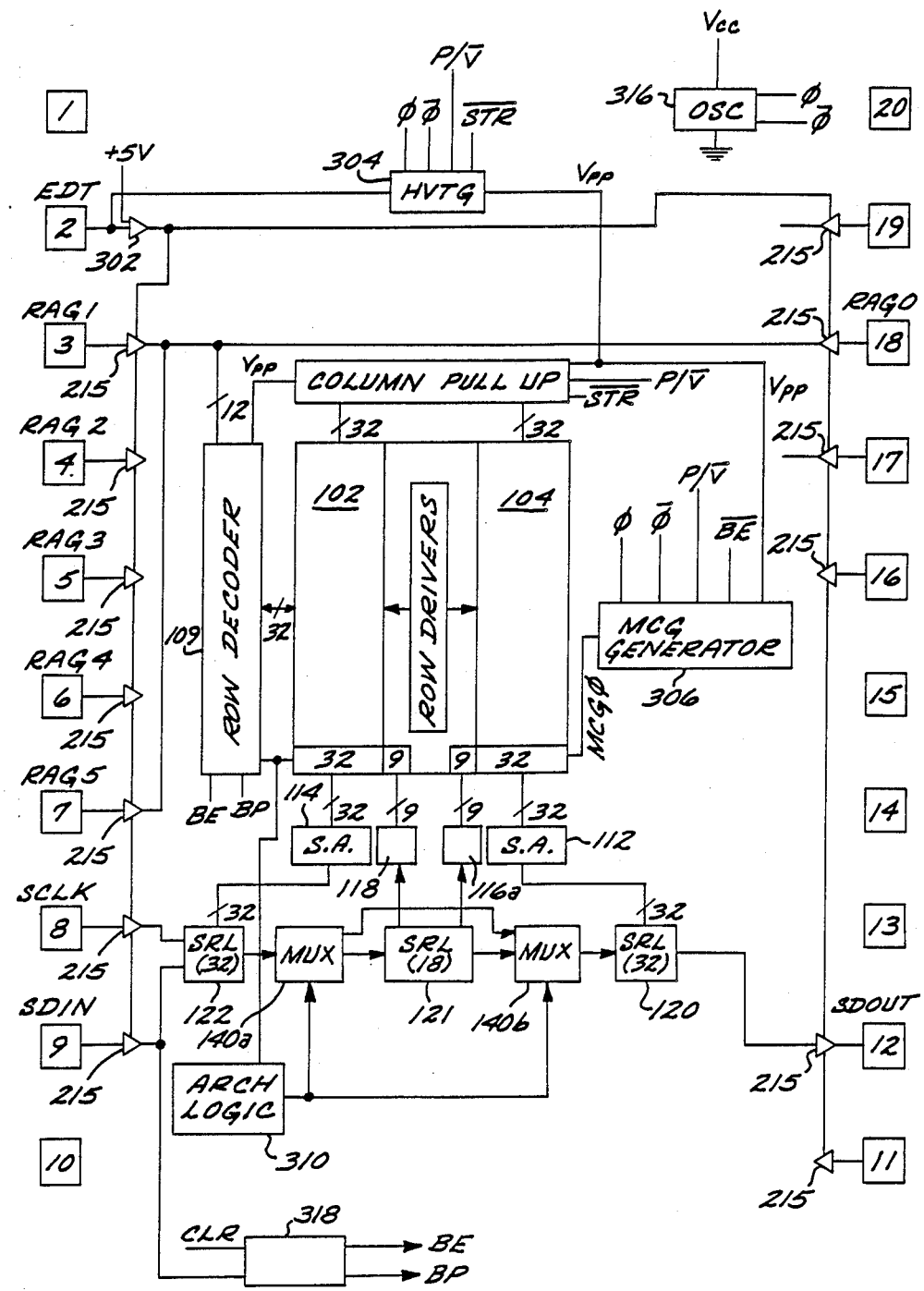
FIG. 8 is a simplified block diagram of a programmable logic device employing the invention when in the edit mode.

FIG. 8 is a simplified block diagram of this embodiment of the PLD when configured in the edit mode. When a super voltage, nominally 20 volts, is applied to pin 2 of the device, a super voltage sense circuit comprising comparator 302 senses the super voltage and issues logic signal "EDT." The pin 2 signal is also coupled to high voltage transfer gate 304, which gates "on" or "off" the programming voltage $V_{PP}$ (20 volts) in dependence on the state of the signals "P/$\overline{V}$" (pin 19) and "$\overline{STR}$" (pin 11). As is conventional, pump clock signals $\phi$ and $\bar{\phi}$ are internal oscillator outputs which are coupled to diode-capacitor pump circuits to generate high voltages which are used as gate signals to control gate 304 for passing high voltages. The active "EDT" signal also is coupled to the drivers 215, which are tristated by an active "EDT" signal. Thus, application of the super voltage to pin 2 reconfigures the PLD from the normal user mode to the edit mode, with different functions on all pins as shown in FIG. 4(b). The inputs to pins 3-7 and 18 serve as the selection bits for the row decoders 109 during the edit mode. In addition $V_{PP}$ is applied to the column pull-up, row decoders and to the matrix control gate generator 306, in dependence on the control bits to gate 304.

Like reference numerals are employed in FIG. 8 indicate corresponding elements to those shown in FIG. 3. Thus, the individual sense amplifiers for each product term are represented by amplifier sections 114, 118, 116a and 112. The stages of the SRL are grouped in 32 stage SRL section 122, 18 stage SRL section 121 and 32 stage SRL 120. Multiplexers 140a and 140b selectively couple serial data to or around 18 bit SRL section 121, in dependence on architecture logic circuit 310. Thus, the SRL section 121 is bypassed except when row 60 is to be accessed.

A "bulk erase" cycle is performed in the edit mode, whereby each of the floating gate transistors of the array cells is programmed into the enhancement mode. To bulk "erase" (or bulk program) the user array cells, a logical "CLR" signal is generated by selecting row 63. Logic circuit 318 is gated by the "CLR" signal and the data at the SDIN port and generates either the bulk erase control signal "BE" or the bulk program control signal "BP," in dependence on the data at the SDIN port. The CLR signal forces SCLK and $\overline{SCLK}$ both high, opening up the SRL registers to immediately propagate the data at the SDIN port through all stages of the SRL. This eliminates the need to clock the data through the registers, since the appropriate data of the same logic level are loaded into the SRL.

To bulk erase the cells, the appropriate data are loaded into the SRL, and the "MCG" line is raised to +20 volts. The logic signal $\overline{BE}$ is coupled to the MCG generator 306 to force the MCG signal to +20 volts when $\overline{BE}$ goes low. A normal programming cycle is then carried out to program all the memory cells to the erased state (enhancement mode).

Once the bulk erase cycle is completed, a programming cycle may be carried out. A particular row is enabled, and appropriate data are loaded into the SRL to either enable programming the particular sense transistors to the depletion mode or to inhibit such programming, leaving the particular sense transistor in the enhanced mode. After the SRL has been loaded with data, the "PGM" signal at the gate of transistor 225 may be activated, gating transistor 225 to the conductive state, "PROGRAM" is taken high (+20 volts) to connect the column pull-up to the product term ground. If the data signal at node 271 is low, then the product term ground line 235 is clamped to ground, because the "column pull-up circuit" comprises a high impedance voltage source and cannot supply enough current to raise the voltage level above ground. During the programming cycle, the MCG signal is grounded. Thus, the selected row cell has a ground potential applied to both the gate and the drain, and no potential is created across the gate/drain to cause tunneling of electrons from the floating gate. As a result, the floating gate transistor of the cell will remain in the enhancement mode.

If a "high" data signal is present at node 271 during the edit mode, the product term ground line will not be clamped to ground, and the high (20 volts $-V_T$) programming voltage from the column pull-up source will be applied to the drain of the selected floating gate transistor. Electrons will tunnel from the floating gate to the drain, programming the transistor to the depletion mode. This program voltage is nominally applied for ten milliseconds, a conventional programming pulse length.

To summarize the operation of the array during the programming cycle of the edit mode, the "MCG" signal is grounded, and transistor 225 turned on by a "PGM" signal applied to its gate. Only one of the 32 cells in the product term side has been activated, by application of a select signal to the select transistor to the cell to cause the select transistor to conduct. The data in the SRL is applied to the product term ground line. If the data signal is low, the product term ground line is grounded and the transistor remains in the enhancement mode, requiring an elevated gate voltage level to cause the transistor to conduct. During normal circuit operation, the normal cell interrogation voltage is low enough such that the floating gate transistor will not conduct when in the enhancement mode. On the other hand, if the data signal at node 271 of the SRL stage is "high," then a sufficient field will be impressed across the gate and drain to cause electrons to tunnel from the floating gate to the drain via the 100 Angstrom tunnel oxide, thereby programming the cell to the depletion mode.

Programmed Data Verification

Another novel aspect of the disclosed PLD is the capability of performing high speed verification of the data stored on the matrix cells. In this verification cycle, the same sense amplifiers used during normal user operation of the device are employed to sense the state of the array cells and to perform a parallel load of the SRL. During this mode, the "VERIFY" signal applied to the gate of transistor 240 (FIG. 7) is activated, so that transistor 240 conducts, coupling the output 258 of the sense amplifier 250 to node 268 of the corresponding stage of the SRL. At the same time, the "PGM" and "SCLK" signals are low, so that the stages of the SRL are isolated from each other and from the respective product term ground lines. With the $\overline{SCLK}$ signal high, the data signal at node 268 is propagated to the output node 271 of the SRL stage.

As with the programming cycle, only one cell in each column or product term line of the array is selected at any given time during the verification cycle. Thus, the data contents of an entire selected row of the matrix may be loaded in parallel into the respective SRL stages during the verification cycle. The "VERIFY" signal is then brought low to turn transistor 240 off and isolate the sense amplifiers from the SRL. The contents of the SRL may then be shifted serially out of the SDOUT port (pin 12) of the device for verification, by activation of the SRL clock signal SCLK. The PLD test head is adapted to perform the comparison between the outputted data and the desired data.

Logic Verification

Another novel feature of the PLD is its logic verification capability, allowing virtually 100% testing capability of the output logic circuits on the device in a nondestructive manner. To carry out the verification, at least one cell in each product term must be conductive. A "bulk program" operation may be employed placing all the floating gate transistors into the depletion mode. This is done by loading appropriate data into the device SDIN port in a manner analogous to that described for the bulk erase cycle. In the disclosed embodiment, row 63 is selected, and all row decoder outputs go high (in a user clear mode) to 20 volts to select all rows; the "MCG" signal is dropped to the ground potential. A normal programming cycle is then carried out.

Once the array has been bulk programmed to the conductive or "programmed" state, then "apparent array patterns" are serially loaded into the SRL, by selection of the edit mode as described above for the programming cycle. This desired pattern may be developed to verify a particular logic path through the sense amplifiers and output circuitry. To verify all the logic paths, it will normally be necessary to employ a plurality of apparent array patterns.

The device edit mode is then exited by removing the super voltage signal from pin 2, and the logic verification mode is entered. Application of a super voltage to pin 3 of the PLD selects the logic verification mode, and results in activation of the "PGM" signal applied to the gate of transistor 225, such that the transistor becomes conductive, and node 271 of the SRL stage is coupled to the product term ground line 235.

To verify the logic paths, it is not necessary to program the array cells with the test bit pattern. Since at least one of the data storage transistors of the cells in a particular product term is in the conductive state, the logic state at node 270 of the SRL will, with transistor 225 in the conductive state, be forced onto the input of the sense amplifier 250. Transistor 240 is turned off in this mode. Thus, by comparing the "apparent array pattern" with the data at the PLD output pin, verification may be obtained of the logic paths.

To summarize the sequence of steps for the logic verification, at least one of the sense transistors per product term is programmed to the depletion mode. Then the PLD edit mode is entered, and the SRL is loaded with the desired pattern. Next, the PLD edit mode is exited, and the logic test mode is entered by applying a super voltage to a super voltage pin 3 of the PLD.

The logic verification capability also allows functional testing to be conducted after the device has been programmed, and without altering the user data which has been programmed into the array. At least one cell will have been programmed to the depletion mode for each usable product term during the programming cycle. Thus, the apparent bit pattern loaded into the SRL will be propagated through the conductive cell during the logic verification mode, and forced onto the input of the product term sense amplifier. Thus, the output logic may be tested, e.g., in the field, without reprogramming the device.

Device Waveform Timing

Figure 9:
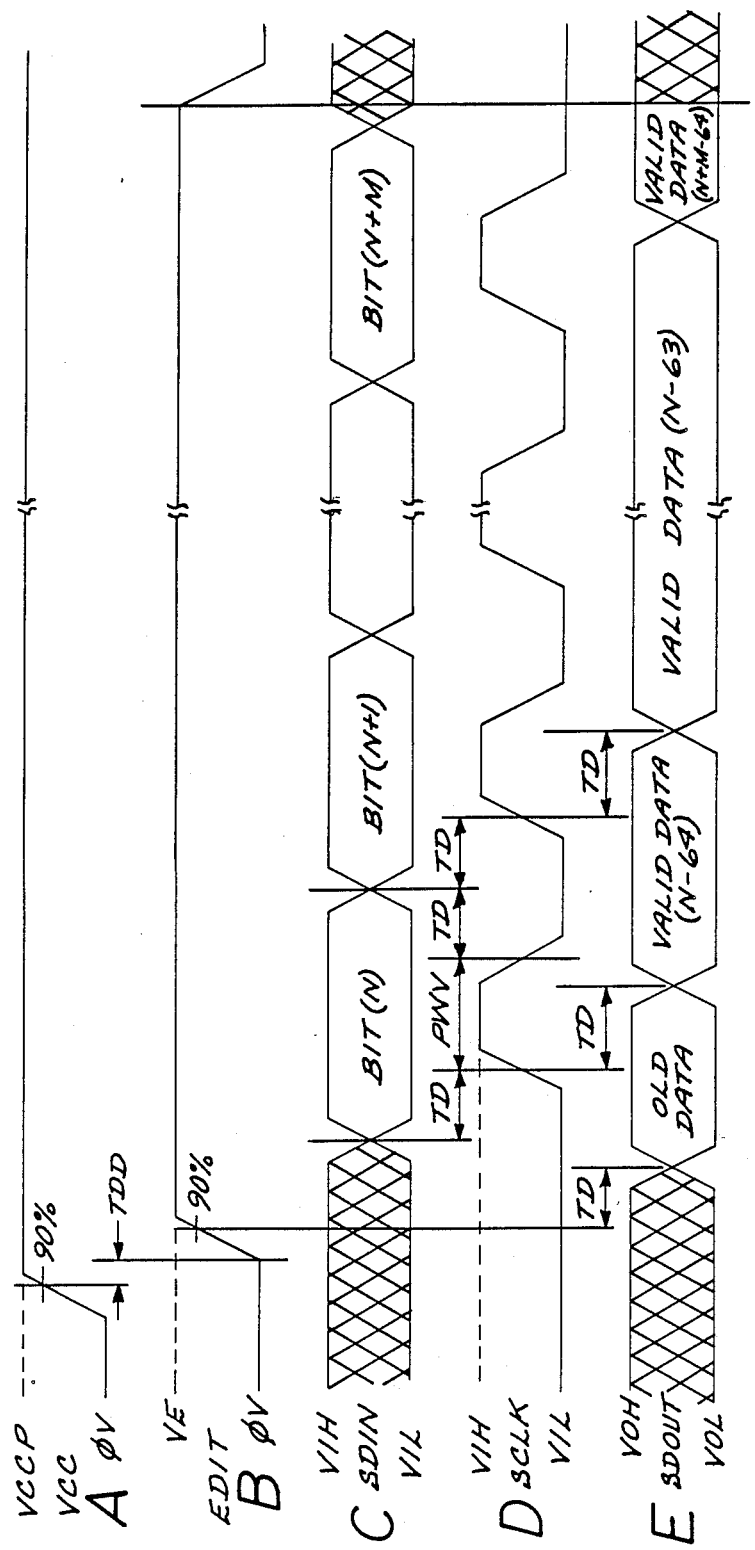
FIG. 9(A-E) is a timing diagram illustrative of the loading of programming data into the shift register latch.
Figure 10:
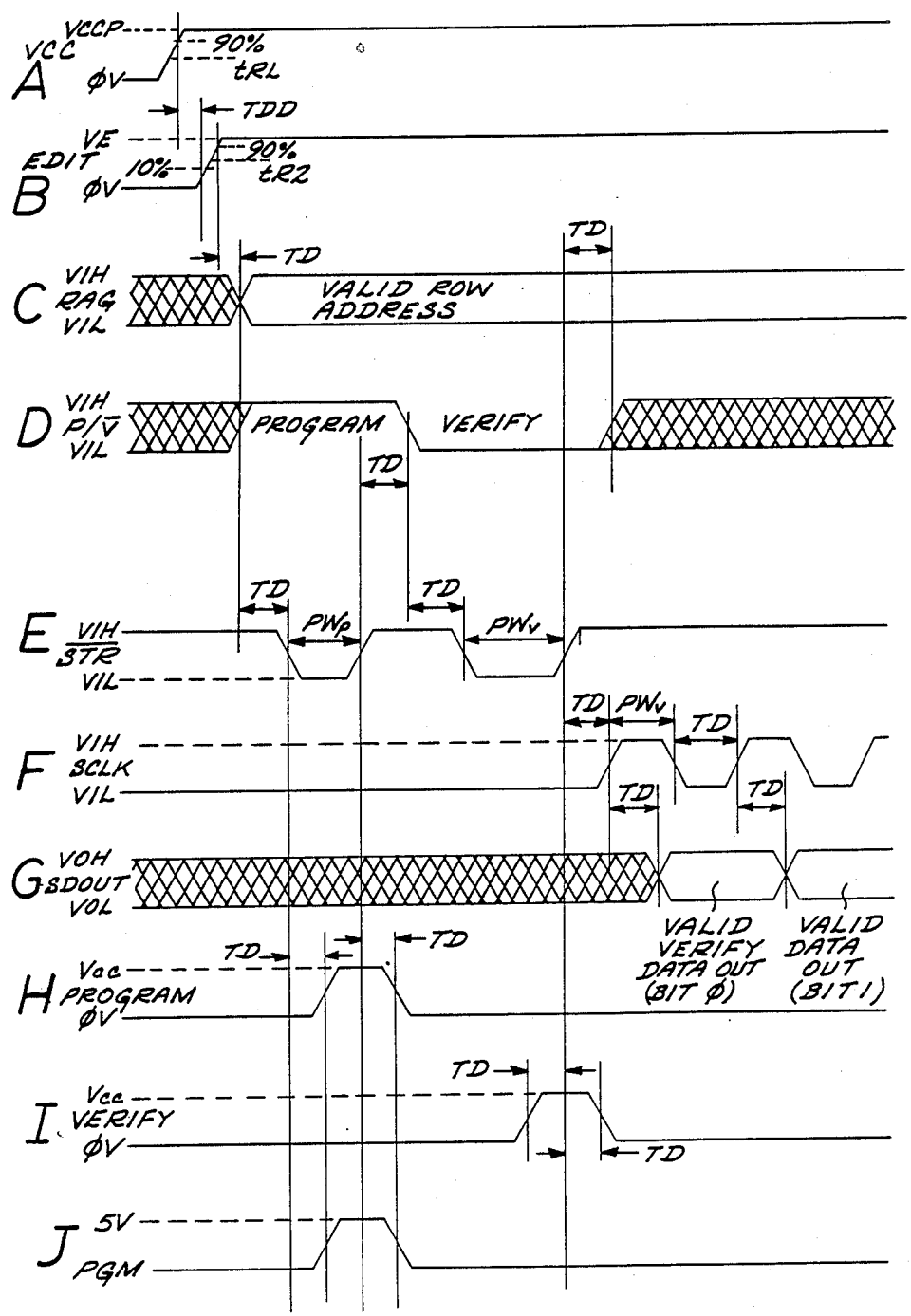
FIG. 10(A-J) is a timing diagram illustrating the programming and verification of data in the matrix.
Figure 11:
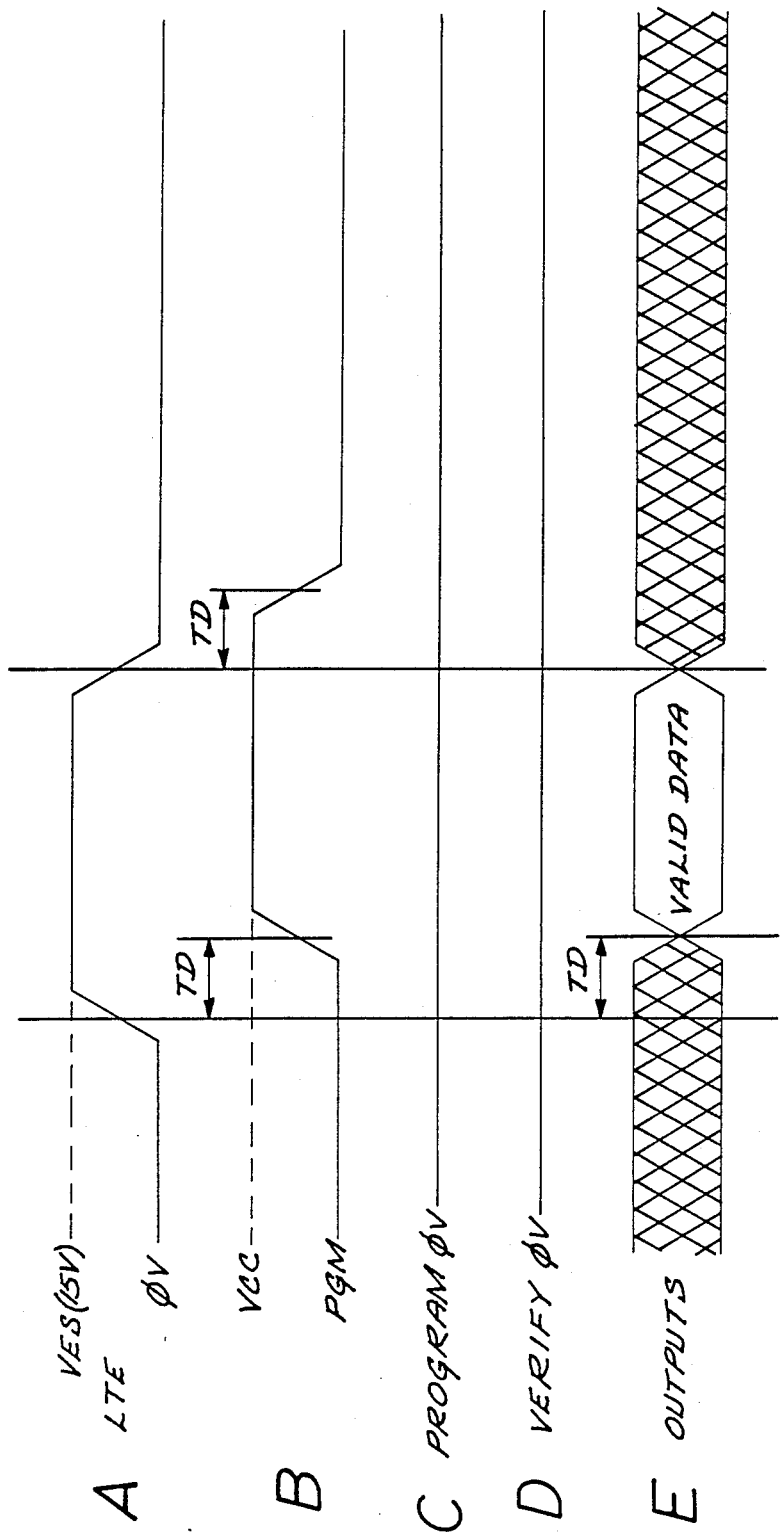
FIG. 11 is a signal timing diagram illustrating the logic test mode of the preferred embodiment.

Referring now to FIGS. 9–11, waveform timing diagrams are provided which are illustrative of the signal sequence for loading the SRL programming/verifying the array contents and verifying the operation of the output logic. To load the SRL with data, signal VCC (pin 20) is raised to VCCP, nominally 5 volts (FIG. 9(a)). After a time delay $T_{DD}$ to allow the VCC supply to settle, typically 20 microseconds, the device edit mode is entered by raising the EDIT signal applied to pin 2 from zero to VE, the edit/verify supply level, nominally 20 volts (FIG. 9(b)). The VCC and EDIT signals are held high during the SRL loading sequence (and during the array program/verify sequence as well.)

After the EDIT signal has settled, SDIN data is applied to, the serial data input port for the device in the edit mode (pin 9). The SDIN signal is illustrated in FIG. 9(c), and is loaded into the SRL at the clock rate determined by the SCLK clock signal shown in FIG. 9(d). The time intervals TD and PWV represent the pulse sequence delay and the verify pulse width ranging from 1 to 10 microseconds, nominally 5 microseconds. Thus, for each clock pulse, one bit of data is loaded into the SRL; FIG. 9(c) illustrates the loading of bits N through N+M.

FIG. 9(e) illustrates the SRL contents being serially unloaded from the device through the serial data output port, pin 12. The data is serially unloaded, with valid data present on the leading edge of the SCLK clock signal as illustrated in FIGS. 9(d) and 9(e). Serial data bits (N-64) through (N+M-64) are shown in FIG. 9(e).

Once the SRL has been loaded with the desired data, a selected device array row may then be programmed in accordance with the SRL contents; as illustrated in FIG. 10. VCC and EDIT are at their elevated levels, VCCP and VE, respectively (FIGS. 10(a),(b)). Next, a valid row address RAG0-RAG5 is presented to the row address gate ("RAG") ports (pins 18 and 3-7), to select the row of the matrix to be programmed with the SRL contents. In the edit mode, the matrix may be programmed with data from the SRL (the program cycle) and/or the matrix contents loaded into the SRL for verification (the data verification cycle), in dependence on the state of the "P/V" control signal presented to pin 19. FIG. 10(d) illustrated the P/$\overline{V}$ signal in the "program" or high state, and in the inverted "verify" state, during different time intervals.

Once the valid row address has been provided, and the program/verify state determined, then the matrix program step is executed by bringing the $\overline{STR}$ signal (FIG. 10(e).) low for a program pulse width PWp, nominally 10 milliseconds. If the verify state is selected, $\overline{STR}$ need only be brought to the low state for a nominal verify pulse width of 5 microseconds to load the matrix data onto the SRL stages. FIGS. 10(d) and 10(c) illustrate the inter-relationship of P/$\overline{V}$ and $\overline{STR}$ for both the data programming and verification sequences.

Once the matrix data has been loaded into the SRL, the SRL contents may then be unloaded, after $\overline{STR}$ is brought to its normal high state to isolate the SRL from the product term sense amplifier. The clocking of data out of the SDOUT port of the device is illustrated in FIGS. 10(f) and 10(g). The VCC and EDIT signals remain in their high states during this operation.

FIG. 11 illustrates the signal waveforms during the logic test mode for this embodiment. As shown in FIG. 11(a), this mode is selected by raising the LTE signal at pin 3 to +15 volts. The PGM signal goes high (FIG. 11(b)), coupling the SRL to the product term ground line 235 though transistor 225. The PROGRAM and VERIFY signals are both low so that the SRL data is forced onto the sense amplifier and the output logic.

It is noted that logic circuitry internal to the PLD is adapted to generate the "VERIFY," "PGM" and "PROGRAM" gate control signals applied to the gate of transistors 225, 240, and 275 of FIG. 7. These signals are determined by the $\overline{STR}$, P/$\overline{V}$, RAG signals, VCC and EDIT signals. Thus, for example, to obtain high "PROGRAM" and "PGM" signals requires P/$\overline{V}$ to be high and $\overline{STR}$ to be low. Circuitry to develop the appropriate "VERIFY," "PROGRAM," and "PGM" signals is omitted, for purposes of clarity, as those skilled in the art are readily able to design such circuitry.

SECOND EMBODIMENT: IN-SYSTEM PROGRAMMABLE LOGIC DEVICE

Aspects of another embodiment of the PLD are illustrated in FIGS. 12-25. While the embodiment of FIGS. 1-11 is adapted for programming while connected to a dedicated programming machine, this second embodiment is adapted to be programmed while installed in a user's system. To achieve this capability, the device is provided in a 24 pin package, including eight input pins and eight input/output lines which are dedicated for use in-system with the normal operating state I/O functions. Thus, instead of employing certain ones of the I/O pins in the programming states, as the first embodiment, for such uses as receiving the row address selection data, super-voltage application and the like, these pins may be isolated from the device circuits during the utility states used to reconfigure the device. As a result, the external system signals driving these pins will not affect the reconfiguration process. The row address data is entered into the device via the serial data input pin in the same manner as the programming data, the number of SRL stages being increased by six row address gate ("RAG") stages to accommodate the RAG data. The RAG stages of the SRL are in turn coupled to the row address decoders to select the particular row to be programmed or interrogated.

Another distinction between the first and second PLD embodiments is the manner in which the device modes or states are controlled. Instead of controlling the device mode by the particular application of super-voltages to certain of the device pins to place the device in a particular mode, as with the embodiment described above with respect to FIGS. 1-11, the state of the second embodiment is controlled by an internal synchronous state machine. The state machine executes several state equations whose state variables are a MODE signal and the serial data input provided on two dedicated device pins and the present state output. Based on the state variables, a new device state output is calculated. The use of the state machine to control the state sequencing simplifies the external state control signals required to reconfigure the device and minimizes the number of required external pin connections.

A further aspect of the invention is the provision of means for latching the device output data upon a state transition from the normal operation state to one of the device utility states to prevent loss of output data. This output latch capability is combined with a means for tri-stating the device outputs during the utility states and a programmable selection means for selecting either the output latched data condition or the output tri-stated condition. This feature of the invention allows in-system programming to occur without disruption of the system elements driven by the device outputs.

Still another aspect of the invention is the provision of an internal high voltage generator which generates from the supply voltage the high programming voltages needed to program the floating gate transistors comprising the array memory cells. This feature further reduces the number of external device pin connections needed to reconfigure the device, as well as minimizing system power supply requirements.

These and other features of the embodiment will be described in further detail with respect to FIGS. 12-25. There are many similarities in the structures of the two embodiments, such as, by way of example only, the memory cells, the use of the SRL to rapidly program the memory cells, and the output logic. These similar features will not be described in detail with respect to the second embodiment.

Figure 12:
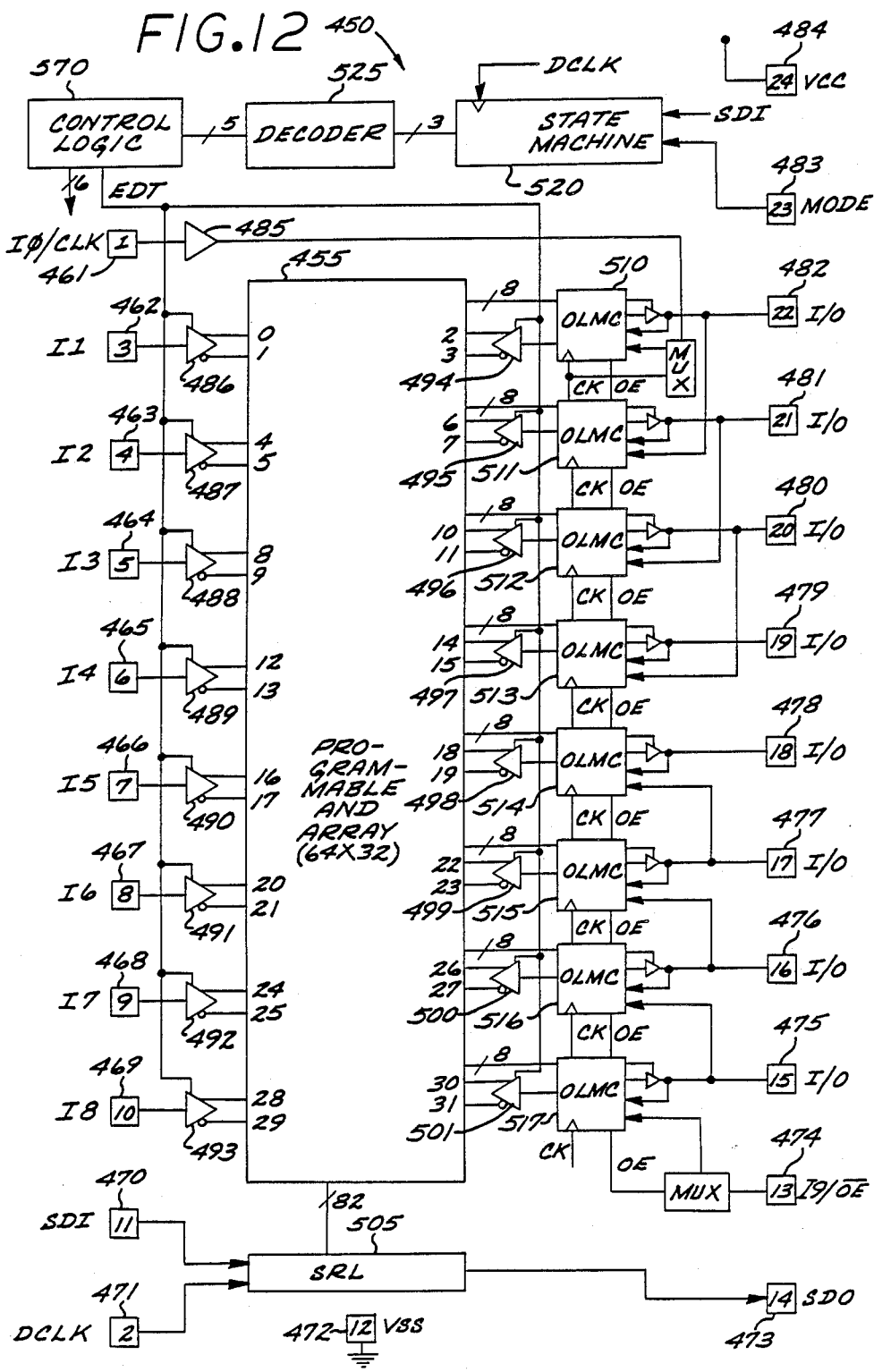
FIG. 12 is a functional block diagram of an in-system programmable logic device embodying the invention.

A functional block diagram of an in-system programmable logic device 450 is shown in FIG. 12. The device 450 includes 24 external pins 461-484 and a programmable user AND array 455, comprising a matrix of 32 rows and 64 columns (or product terms) of programmable cells. The first 32 rows of the matrix comprise the AND array utilized by the user to define the logic functions to be performed by the device during the normal state. The cells are individually programmable, in dependence on the state of a programming bit presented to the cell during a programming state, as described above with respect to the embodiment of FIGS. 1-11. Row 33-56 of the array 455 are considered illegal address space. Rows 57 and 58 are reserved for manufacturer test functions. Row 60 is adapted to store 82 bits defining the architecture configuration array data. Row 61 is accessed by the user to set a user security fuse bit (USF) preventing verification of the array data. Row 62 contains one bit of user-programmed information, the output tri-state control (TC) bit, which selects the output condition during a utility state. Row 63 is accessed by the user to perform a bulk erase of the data programmed in the data cells of row 1-32. This particular array configuration is, of course, merely exemplary of a PLD which may embody the invention.

Pins 462-469 are employed as the input terminals, allowing eight inputs to the device 450. Each device input is connected to corresponding ones of the AND array rows through respective input drivers 486-493. Each of the input drivers provides non-inverted and inverted input signals to respective rows of the array 455. In this embodiment, driver 486 is connected to the respective rows 0 and 1 of the array, driver 487 is connected to the respective rows 4 and 5, driver 488 is connected to respective rows 8 and 9, driver 489 is connected to rows 12 and 13, driver 490 is connected to the respective rows 16 and 17, driver 491 is connected to rows 20 and 21, driver 492 is connected to rows 24 and 25, and driver 493 is connected to the respective rows 28 and 29.

Sixteen of the thirty-two rows of the array 455 are driven by row drivers 494 to 501, controlled by respective ones of the output logic macro cells (OLMC) 510–517. Each of the OLMCS 510–517 is connected to eight of the product terms of the array, and is coupled to an output pin 475–482 of the device 450, which serve as the device output terminals. Each OLMC comprises a feedback path coupled to the respective driver associated with the OLMC to selectively allow an output to be used as an input to the AND array.

Each driver 494–501 comprises a non-inverted and inverter output, each driving a respective one of the rows of the array 455. Thus, driver 494 is connected to the rows 2 and 3 of the array, driver 495 is connected to rows 6 and 7 of the array, driver 496 is connected to rows 10 and 11 of the array, driver 497 is connected to rows 14 and 15 of the array, driver 498 is connected to rows 18 and 19 of the array, driver 499 is connected to rows 22 and 23 of the array, driver 500 is connected to rows 26 and 27 of the array, and driver 501 is connected to rows 30 and 31 of the array.

All of the row drivers 486–501 are configured to be tri-stated, i.e., placed in a high impedance condition, upon application of an active EDT signal from control logic 570 to isolate the respective rows from the input pins 461–471 and the OLMCS 510–517 (FIG. 12).

The device 450 further comprises a state machine 520 for providing the internal state control for the device, allowing the device to be programmed in-system. The state machine 520 is connected to a state machine decoder 525, which decodes the state machine outputs and drives the output logic 570, in turn providing various control signals internally to the device for controlling its state (FIG. 13).

As with the first embodiment, each particular array cell comprises an electrically programmable sense transistor and a select transistor and may be viewed as programmably connecting a row, i.e., the input signal from the respective output of the appropriate row driver, to a product term. The sense transistor comprises a floating gate field effect transistor which employs Fowler-Nordheim tunneling to achieve the programmed conductive state, as described above with respect to the embodiment of FIGS. 1–11.

With the device installed in the user's system, the input and output pins are connected to other devices comprising the system, and it may not be assumed that the input pins of the device will be available to input the necessary control signals or programming data to carry out the programming of the device into a particular array logic architecture. In accordance with one aspect of the invention, means are provided to input all necessary control signals and data needed to reconfigure the device through a dedicated set of device pins without regard to the logic conditions of the input or output pins, and for programming the cells of the AND array 455 with non-volatile data. The data input means comprises the serial entry of the programming data as well as data defining the particular cells to be programmed by the data through the SDI pin 470 into the serial register latch 505. Thus, the input and output pins 462–469 and 475–481 of the device are not employed to provide a row selection or decoding function during the device programming states. These features of the invention are described in more detail below.

Figure 13:
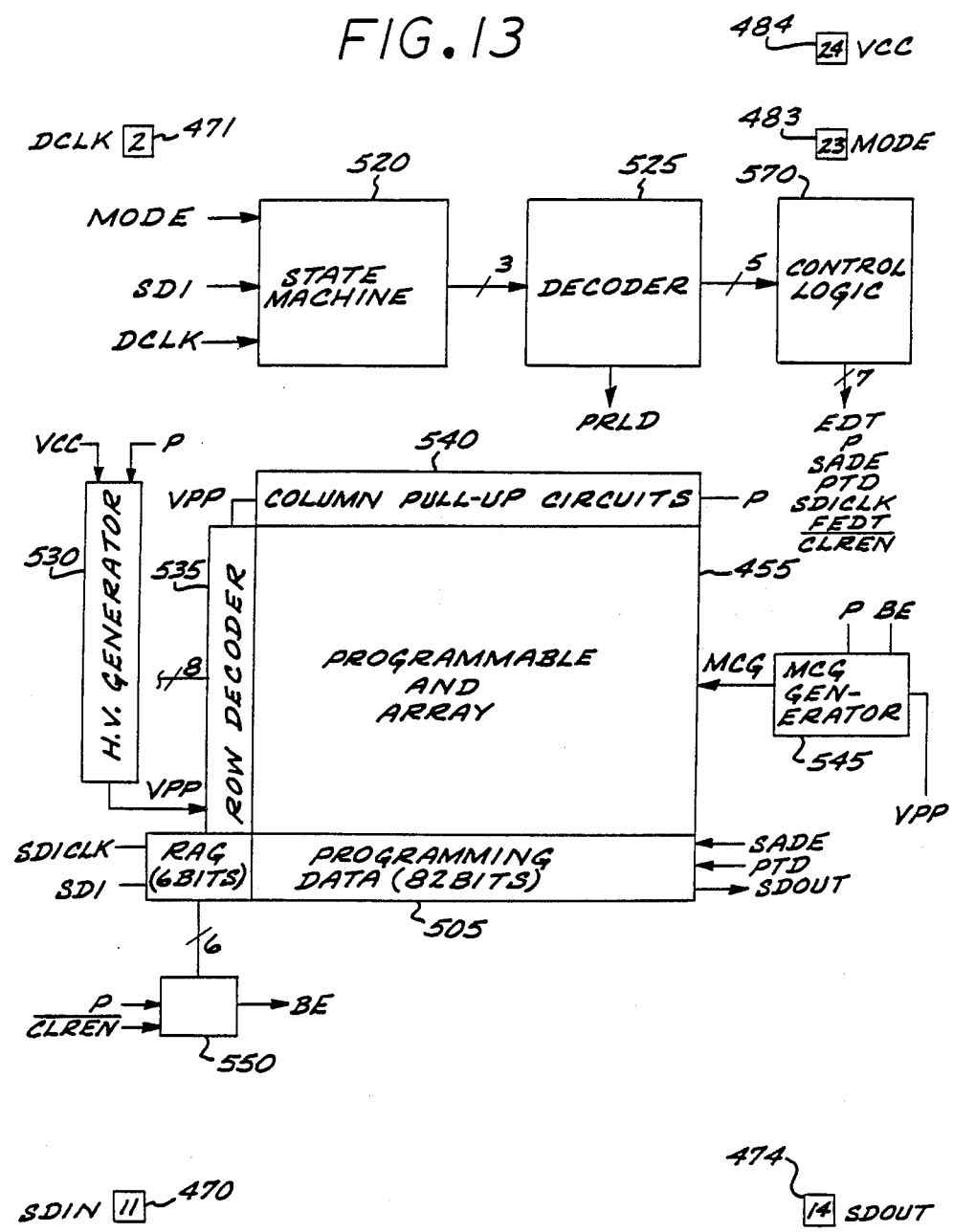
FIG. 13 is a simplified functional block diagram of the device of FIG. 12, illustrative of the relation of the logic signal provided by the state machine and their utilization in the device.

FIG. 13 is a simplified functional block diagram of the device 450, illustrative of the active device elements during the utility states and the internal control signals and their utilization by the various elements. The state machine 520 receives as input signals the external state control signals DCLK, MODE and SDI which are provided as inputs to the device 450 through the respective pins 471, 483 and 470. In dependence on the logic states of these signals and on the present device state, on the rising edge of DCLK the machine 520 generates a three-bit state output, which is decoded by the decoder 525 and with control logic 570 generates internal control signals PRLD, EDT, P, SADE, PTD, SDICLK, FEDT, and $\overline{\text{CLREN}}$. As will be described in further detail below, the internal control signals are employed for the various control functions necessary to operate the device in the normal operating state as well as the utility states necessary for reconfiguring the device.

Circuit 550 generates the bulk enable BE signal when the P and $\overline{\text{CLREN}}$ signals are both active. The MCG generator 545 performs functions similar to the generator 306 of FIG. 8 for the first embodiment.

As shown in FIG. 13, the SRL 505 in this embodiment comprises 88 register stages, 82 stages being connected to the respective product terms of the array 455 as described above with respect to the embodiment of FIGS. 1–11, and six stages of the SRL being employed to receive a six-bit row address gate (RAG) word defining a particular row address for selecting the particular one of the rows to be programmed or interrogated. Thus, the serial data provided as an input to the device through pin 470 comprises row selection data and the programming data. The row selection data is decoded by row decoder 535 to control the particular one of the rows of memory cells of the array 455 whose memory elements are to be programmed during a particular programming cycle. The signals at the normal input terminals 462–469 and output terminals 475–482 are isolated during the programming cycle, in contrast to the manner by which the PLD of FIGS. 1–11 is programmed. This allows the device 450 to be programmed while installed in the user's system without placing voltage and timing requirements on these normal input and output terminals.

The device is provided with an external supply voltage VCC, nominally +5 volts, on pin 484 of the device. An on-chip high voltage generator 530 receives the supply voltage VCC and the internal control signal P, and when the signal P is active, multiplies the supply voltage up to the high programming voltage VPP, typically about +20 volts, for use in driving the high impedance column pull-up circuits (for example, circuit 280 shown in FIG. 7 for the first embodiment) used in programming the cells of the array 455 in a programming state. The provision of the internal high voltage generator eliminates the need for external supply of the programming voltage to the device and conserves the number of required external pin connections. Since the generator operates only when the signal P is active, which occurs only in device states in which programming may occur, the high voltage VPP is not generated during the normal operating states, which could otherwise lead to false programming and the like. Voltage multiplier circuits are well known in the art, and need not be described in detail. One such multiplier is described in the paper, "On-Chip High-Voltage Generation in MNOS Integrated Circuits Using an Improved Voltage Multiplier Technique," by John F. Dickson, IEEE Journal of Solid State Circuits, Vol. SC-11, No. 3, June, 1975. The generator also preferably includes a voltage regulator circuit, such as are known in the semiconductor memory art; an exemplary regulator is described in the paper "High Voltage Regulation and Process Considerations for High Density 5 Volt Only $E^2$ PROMS," by Duanne H. Oto et al., IEEE Journal of Solid State Circuits, Vol SC-18, No. 5, Oct., 1983, pages 532–538.

Figure 14:
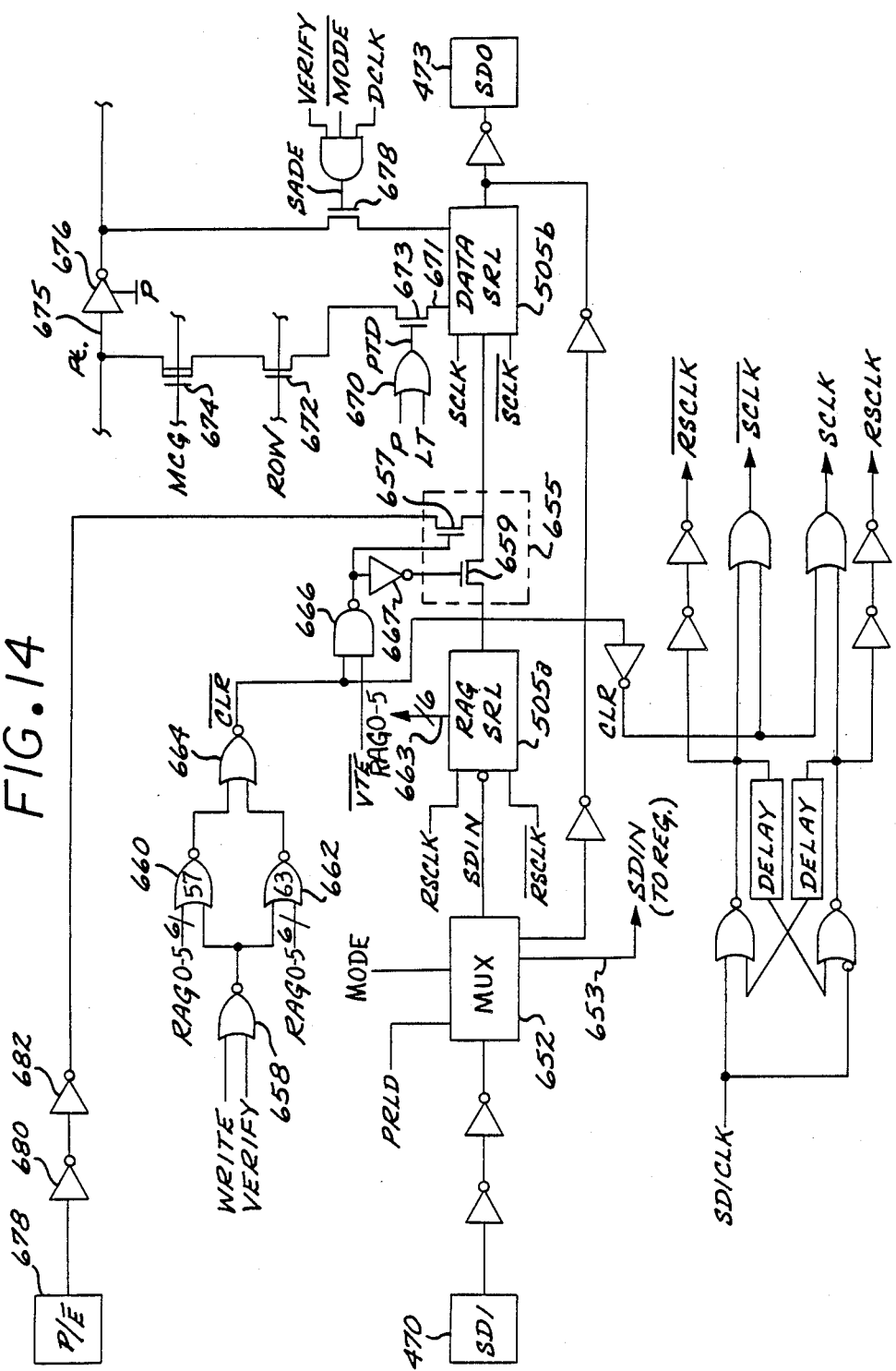
FIG. 14 is a schematic diagram depicting the programming logic circuitry for programming and verification of the array cells of the second embodiment.

FIG. 14 shows a simplified logic diagram of the RAG SRL 505a and the data SRL 505b and associated programming and bulk erase logic circuits. The serial data is provided at SDI pin 470, and is passed through a pair of inverting amplifiers to the preload/SDIN multiplexer 652. Multiplexer 652 provides a means for selectively coupling the input data to the RAG SRL 505a in one multiplexer condition or to the output data registers and the SDO pin 473 in a second multiplexer condition when the PRLD control signal is active. The latter condition occurs during the "Diagnostic: Register Preload" state to be described further below.

One output of the multiplexer 652 is connected to an inverted input of the RAG SRL 505a, which comprises six cascaded register/latch stages to be described in more detail below. The six latched RAG outputs from the respective register stages comprise a six bit RAG word, RAG0–RAG5, which is coupled to line 663 to the row decoder 535 to select one row of matrix cells to be programmed or interrogated.

The final stage of the RAG SRL 505a is coupled as one input to multiplexer 655. A second input is provided via transistors 657 and 569, for purposes of providing bulk erasing data to the data SRL 505 when the signal DCLR is active.

Gates 657–660, 662 and 664 provide a means of driving bulk erase or bulk programming data into the data SRL 505b without entering the data through the SDI port. Gates 660 and 662 represent the row decoders for rows 57 and 63 (employed for manufacturer and user clear functions.) Under an appropriate set of logic control signals driving these gates, the transistor switch 659 is non-conductive, isolating the RAG SRL 505a from the data SRL 505b, and the transistor 657 is gated to the conductive state to provide the bulk erase programming data (low logic level internally) to the data SRL 505b from pin 678.

The data SRL 505b is 82 stages in length, comprising register latch stages such as described above with respect to FIG. 7 (the first embodiment). Each register/latch stage is coupled to a corresponding one of the product terms of the array 455, as indicated generally by line 671. An exemplary memory cell, comprising select transistor 671 and sense transistor 674 is depicted in FIG. 14 as connected to the data SRL through a transistor 673 gated by the signal PTD, corresponding to the signal "PGM" which gates transistor 225 in FIG. 7. Thus, the signal PTD must be active to provide the SRL data to the product terms to program the memory cells. The exemplary product term 675 is coupled to sense amplifier 676, whose output is coupled to the corresponding OLMC (not shown), and also to the corresponding stage of data SRL 505b through transistor 678. This transistor is gated by the signal SADE, which is active only when each of the signals VERIFY, $\overline{\text{MODE}}$ and DCLK are active, to latch the data condition of the selected cell into the SRL stage for subsequent verification, and corresponds to the transistor 240 which is gated simply by the signal VERIFY as employed in the first embodiment (FIG. 7.)

FIG. 15 shows a typical one of the six SRL stages comprising the RAG SRL 505a. These stages are very similar to the stage 260 illustrated in FIG. 7 with the additional elements shown in FIG. 14. Thus, in the exemplary stage 550, the transistor switches 551 552 and 553 are gated on and off by the respective clock signals RSCLK and $\overline{\text{RSCLK}}$ to propagate the serial data entered through the SDI port through the stages of the RAG SRL 505a. Inverter pair 554 and 555 are configured as a latch to latch the data at the input to the stage 550, pending the next clock transition. Similarly, inverter pair 556 and 557 also are configured as a latch. Node 558 is coupled to the next stage of the SRL 505a, in the same manner as described above with respect to FIG. 7, or in the case of the last stage of the RAG SRL, to the multiplexer 652 shown in FIG. 14.

The stage 550 further includes an additional transistor switch 553 is gated by the $\overline{\text{RSCLK}}$ signal to selectively connect the stage output at node 558 to the RAG latch comprising the inverters 559 and 560. The output of the latch is connected to NOR gate 561, and also through inverter 563 to switch 564, gated by the SADE signal generated by the control logic 570. Thus, the latched output signal may be selectively fed back to the input of the SRL stage. The output of the NOR gate 561 is the signal $\overline{\text{RAG}}$, and is gated by the signal $\overline{\text{EDT}}$ provided as an input to gate 561. The $\overline{\text{RAG}}$ signal is coupled to NOR gate 562, which is gated by the $\overline{\text{EDT}}$ signal to provide the RAG signal.

There are six of the stages as shown in FIG. 15 which are cascaded together to form the first six stages of the SRL 505. The remaining 82 stages of the SRL 505 are substantially the same as the stages illustrated in FIG. 7, and are cascaded together in the manner described with respect to the device of FIGS. 1–11.

The outputs from the six RAG SRL stages for the row address data comprise a six-bit word RAG-0–RAG5 which is decoded by the row decoder circuits comprising row decoder 535. A separate row decoder circuit is provided for each addressable row of the array. The six-bit input word RAG0–RAG5 is coupled to each of the row decoders to select one of the rows to be programmed. An exemplary decoder circuit 630 is depicted in FIG. 16. The RAG0–RAG5 signals driving the decoder circuit may be provided in either non-inverted or inverted form, as indicated in FIG. 16, in dependence on the silicon programming for the particular decoder circuit. This selection of inverted/non-inverted inputs to the decoder circuit determines the decoder row selection function, i.e., which one of the 64 combinations of the input RAG word the decoder will be responsive to. The transistors 640 and 641 and the depletion transistors 642, 643 and 644 form a high voltage pull-up circuit which pulls the voltage at node 645 up to VPP, nominally +20 volts, when no path to ground from node 645 exists. Except when performing a "bulk erase" of the array cells, $\overline{\text{CLR}}$ is high, gating transistor 637 to the conductive state.

When the RAG word to which the decoder circuit 630 is responsive drives the circuit 630, each of the transistors 631–636 will be gated to the non-conductive state such that no path to ground from node 645 exists through transistor 637. In this event, node 645 will be pulled high (unless transistor 638 is gated to the conductive state). Node 645 is coupled to each of the select gates comprising the memory cells in the particular row, thereby selecting each of the memory cells in that row. During a "bulk erase" cycle, $\overline{CLR}$ goes low, turning off transistor 637. Then node 645 will be pulled high, unless $\overline{USF}$ is high, irrespective of the state of the RAG word.

The device includes a state machine 520 for internal program control. The MODE, DCLK and SDI pins 483, 471, 470 are used to control the state machine. The machine 520 is implemented as a Programmable Logic Array (PLA) for processing a set of state equations, based on the present state and the logic levels of the MODE and SDI external signals driving pins 483 and 470 to determine the next machine state, represented by a three-bit state word, or the state output. The most significant bit of the input word is the MODE signal, provided to the device at pin 483. The least significant bit of the input word is the SDI signal, provided at pin 470. The least significant bit of the output word is the WRITE signal, the next significant bit is the READ ENABLE signal, and the most significant bit is the NORMAL/PROGRAM signal, which are internally generated logic signals. This convention is illustrated in the diagrammatic depiction of FIG. 17A.

The state machine 520 is implemented as a synchronous machine, since the feedback of the present state to the PLA is activated only on the rising edge of the DCLK signal. State machines are described in the literature, for example, on the book "Introduction to VLSI Systems," by Carver Mead and Lynn Conway, 1980.

Figure 17A:
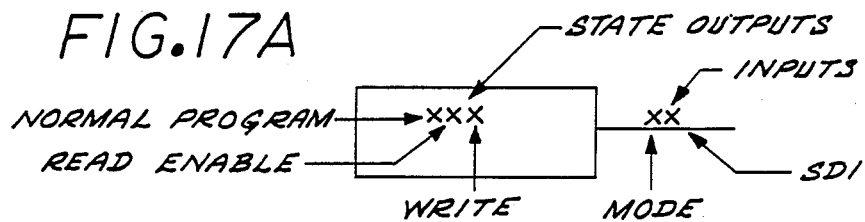
FIGS. 17A and 17B are a state diagram illustrative of the operation of the state machine providing the internal program control for the device of FIG. 12.
Figure 17B:
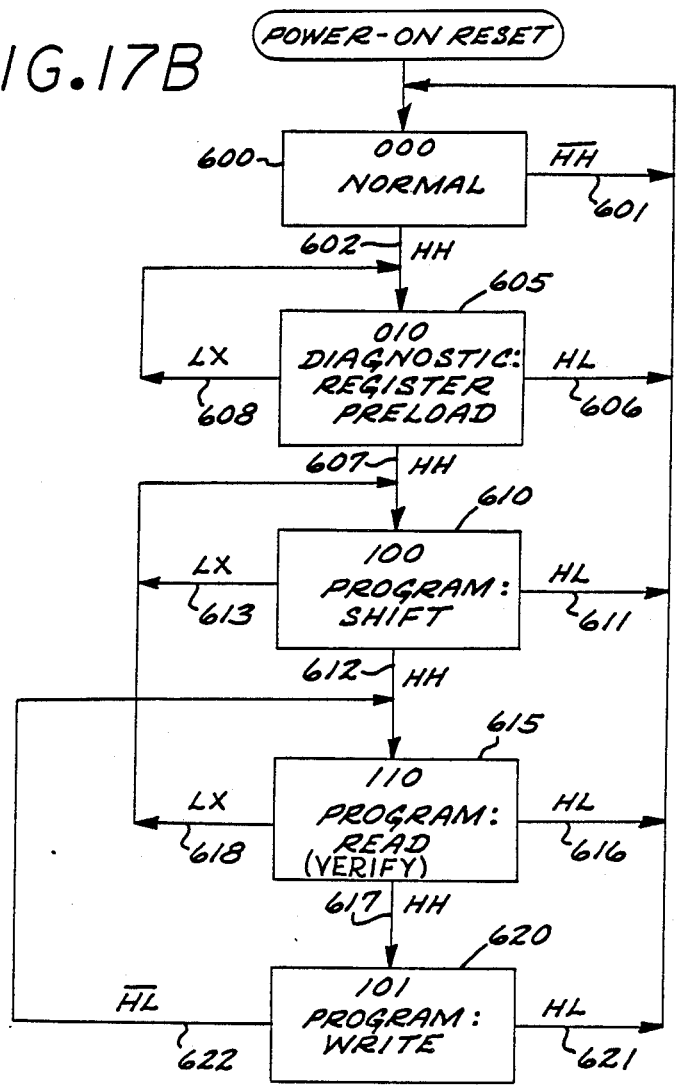

The state diagram for the second embodiment is illustrated in FIG. 17B. The state machine 520 is required to power up in the normal (000) state, to prevent illegal or undesired programming from occurring during the power-on transitory state. A series of reset vectors are provided to execute an immediate transition to the normal state (000) from any other device state on the leading edge of the DCLK signal when the MODE signal is high (1) and the SDI signal is low (0).

There are five possible (legal) machine states, 000, 010, 100, 110 and 101, represented in FIG. 17B by the respective blocks 600, 605, 610, 615 and 620. Each different output state corresponds to a different device operating state. Since the state output is defined by a three bit word, and there are only five legal machine states, the three unused states are considered illegal output states. The state machine is adapted to execute an immediate transition to the normal state (000) from any illegal state on the leading edge of DCLK, independent of the state of the MODE and SDI inputs.

There are at least two transition vectors allowing transition from one particular state. Escape vectors are provided from the states represented by blocks 600, 605, 610, 615 and 620. The other transition vectors provide state transition from the present state to the next state in accordance with the state equations.

The escape vector 601 from the normal operating state 600 is $\overline{HH}$, which results in reset to the normal state on the next DCLK transition; i.e., any input word state except HH results in the output state remaining in the normal state. The other transition vector for the state 600 is vector 602, HH, which will result in transition to the "Diagnostic: Register Preload" state 605 on the next DCLK transition.

There are three transition vectors available for transitioning from the state 605, with the state output 010. One is the escape vector 606, the value HL. In this state, the operator may cause the device to return to the normal state by setting the MODE signal high and the SDI signal low. A second transition vector is vector 608, the value LX, with X indicating the "don't care" state of the SDI signal. Thus, by setting the MODE signal low when the device is in the state 010, the device state transitions back to the same state, thereby allowing data to be input via the SDI pin to preload the data registers. A third transition vector 607, the value HH, transitions to the output state 100 on the next DCLK rising edge.

The 100 state represents the "Program: Shift" state of the device. There are three transition vectors available for effecting transition from this state output. One is the escape vector 611, with a value of HL, for resetting the state output to the normal state (000). A second transition vector 613, with a value of LX, causes the state to remain in the 100 state. Thus, by setting the MODE signal low when the device is the 100 state, the device transition back to the same state, thereby allowing data to be input to load the SRL. The third transition vector is the vector 612, the value HH, which results in transition to the state 615, the state output "110."

The 110 state output represents the "Program: Read" device state. There are three transition vectors available to the operator for transitioning from this state. The first is the escape vector 616, the value HL, which results in resetting the device operation to the normal device operating state (000). The second is the vector 618, the value LX, which results in transition to state 610, state output 100. The third transition vector is vector 617, the value HH, which results in transition to the state 620, state output 101.

The 101 state output represents the "Program: Write" state. There are two transition vectors available to the operator for transitioning from this state. The first is the escape vector 621, the value HL, resulting in resetting to the normal device operating state 000. The second transition vector is vector 622, the value $\overline{HL}$, resulting in transition to state 615, the state output 110.

It will be noted that the state input HH results in state sequencing from the Normal State 600 through each state 605, 610, 615 to the "Program: Write" state 620, facilitating "passing through" particular states to a particular desired state.

In this embodiment, the state machine 520 is implemented as a diffusion programmable, depletion load programmable logic array ("PLA"). The PLA comprises ten product terms and three sum terms.

Figure 18:
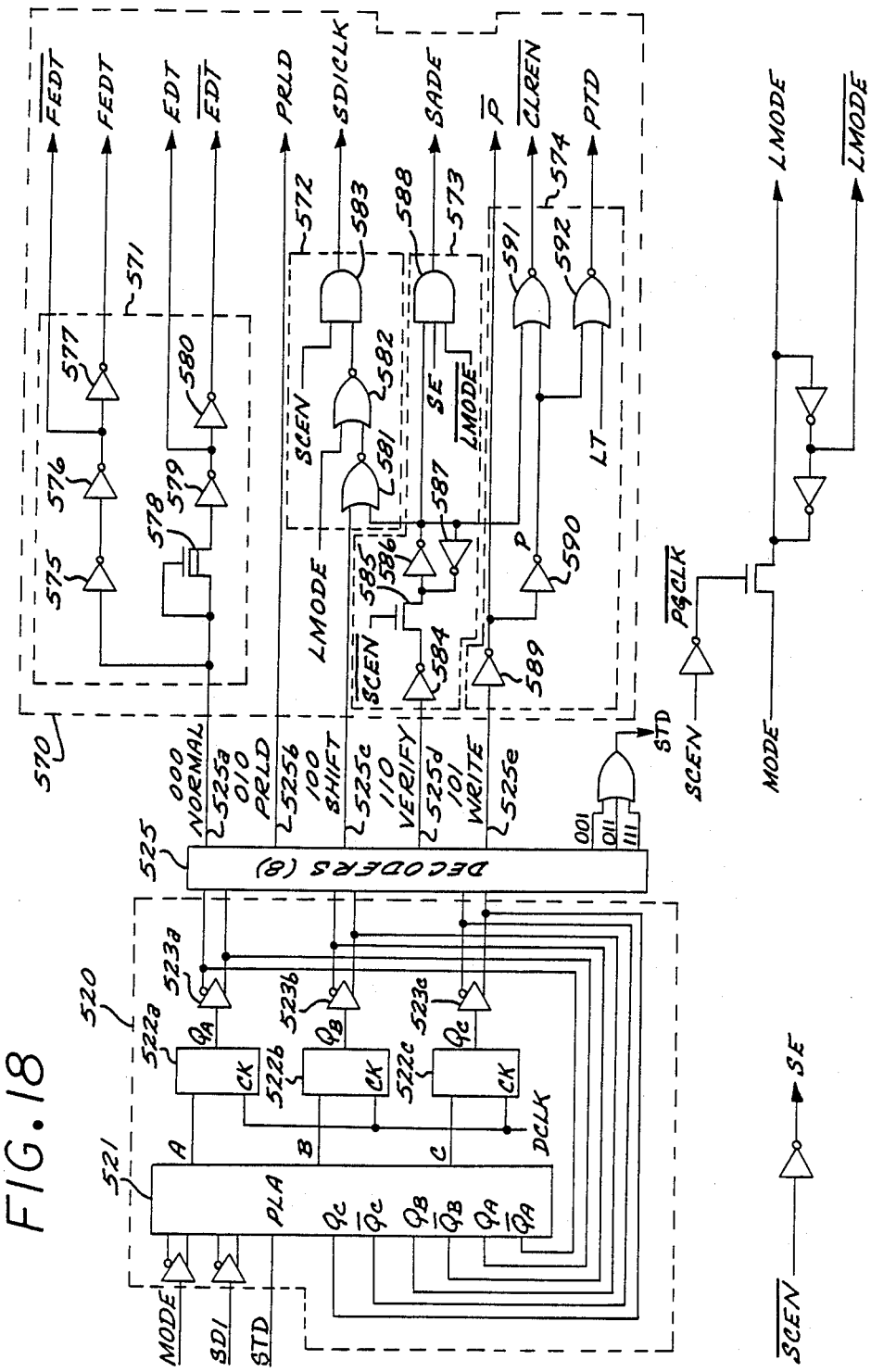
FIG. 18 is a logic diagram of the state machine and control logic for providing the internal program control for the device of FIG. 12.

FIG. 18 is a schematic diagram of the state machine logic. The PLA 521 receives as inputs the MODE and SDI signals in both inverted and non-inverted form, as well as feedback signals $Q_a$, $Q_b$ and $Q_c$ from the state registers 522a-c, in both inverted and non-inverted form. The sum term outputs A, B, C from the PLA 521 are connected to state registers 522a, 522b and 522c. These registers are clocked by the DCLK signal, and the register outputs $Q_a$, $Q_b$ and $Q_c$ are connected to drivers 523a, 523b, 523c, which provide inverted and non-inverted signals to decoder 525. The respective inverted and non-inverted outputs of the drivers are also fed back as inputs to the PLA 521.

The registers 522a, 522b and 522c comprise positive edge triggered D-type flip-flop circuits with a power-on-reset function. The function of these registers is to latch data from the OR plane of the PLA and drive it into the decoders on the rising edge of the DCLK signal. These outputs are also driven back into the AND array of the PLA, providing present state feedback to the PLA.

The PLA is diffusion mask programmed to implement the following state equations:

$$A = MS Q_b \overline{Q}_c + \overline{M} Q_a \overline{Q}_c + MS Q_a \overline{Q}_b \overline{Q}_c + \overline{M} Q_a \overline{Q}_b Q_c + S Q_a \overline{Q}_b Q_c$$
$$B = MS \overline{Q}_b Q_c + \overline{M} Q_a \overline{Q}_b \overline{Q}_c + \overline{M} Q_a \overline{Q}_b Q_c + S Q_a \overline{Q}_b Q_c$$
$$C = MS Q_a Q_b \overline{Q}_c$$
where $M$ = MODE signal $S$ = SDI signal The decoder 525 performs a one-of-eight decode function on the output signals from the state machine 520, providing the state outputs 000, 010, 100, 110, and 101, representing the respective "Normal," "Diagnostic Preload," "Program:Shift," "Program: Read," and "Program: Write" states. The state machine decoders are grouped as three input CMOS NOR gates for decoding the five legal states, as well as the three illegal or unused states. The unused states are decoded to generate one reset signal STD which, combined with the rising edge of DCLK, provides a synchronous reset to the normal state. This feature enables the user to force the normal state from any illegal state with one DCLK independent of any other input (MODE or SDI).

Referring again to FIG. 18, outputs from decoder 525 drive the control logic circuit 570. Circuit 570 uses as inputs four of the five decoder signals generated by the state machine decoders and generates internal control signals. The decoder output signal NORMAL for state output 000 drives the logic circuit 571, generating the four internal control signals EDT, $\overline{\text{EDT}}$ (the edit signals), and FEDT, and $\overline{\text{FEDT}}$ (fast edit signals). The EDT signal is employed to control the row drivers for normal driver operation during the NORMAL state (EDT is at the low logic level).

The decoded state for signal output 010 ("PRLD") is the only decoder output that is employed as a control signal in the same form in which it was generated by the decoder 525. The PRLD signal operates the multiplexer 651 (FIG. 14) when active during the "Diagnostic: Register Preload" state.

The decoded state decoded 100 ("SHIFT") is used with a latched version of the decoded state output 110 ("VERIFY") and DCLK by circuit 572 to generate the SDICLK signal (serial data in clock) which controls the SRL clocks (RSCLK, $\overline{\text{RSCLK}}$, $\overline{\text{SCLK}}$, SCLK, as in FIG. 14).

The decoded signal for state output 110 ("VERIFY") is used along with a latched version of MODE and DCLK by logic circuit 573 to generate a signal called SADE (sense amplifier data enable) which is used during the verify (read) state to transfer the data from the sense amplifier back into the SRL for shifting out the SDO (serial data out) device pin for observation.

The decoded signal for state output 101 ("WRITE") is used along with a latched version of VERIFY in circuit 574 to generate a signal called CLREN (clear enable). This signal is used in the clear (CLR) buffer (row decoder 63) for bulk program/erase operations. The decoded state output 101 is also used by circuit 574 along with the signal LT (logic test) to generate the signal PTD (product term data). PTD transfers data from the SRL to the column pull up for cell programming.

The various signals generated by the decoding logic 570 are depicted in FIGS. 13 and, which generally indicate the usage of the various logic control signals.

FIGS. 24A-H illustrate signal timing waveform for the various external and internal control signals.

An exemplary one of the five decoders for decoding the five legal state outputs is shown in the schematic diagram of FIG. 19. As described above with respect to FIG. 16, the respective inputs $Q_A$, $Q_B$, $Q_C$ to the decoders are provided in either non-inverted or inverted form, in accordance with silicon programming, to select the appropriate decoder output logic signal. Thus, each decoder circuit is silicon programmed to provide a particular active signal (NORMAL, PRLD, SHIFT, VERIFY or WRITE) when the particular combination of $Q_A$, $Q_B$, $Q_C$ to which the decoder is responsive is presented.

The decoder for the three illegal states is shown in FIG. 20. These decoders are adapted to provide an active STD signal when one of the illegal states is decoded, which drives the PLA 521 (FIG. 18) and results in transition to the Normal state (000) on the next rising edge of DCLK. The legal and illegal state decoders operate to provide the function table set forth in Table 1.

TABLE 1

| $Q_A$ | $Q_B$ | $Q_C$ | Function |
|---|---|---|---|
| 0 | 0 | 0 | Normal |
| 0 | 1 | 0 | Diagnostic: Register Preload |
| 1 | 0 | 0 | Program:Shift (SRL) |
| 1 | 1 | 0 | Program:Read (verify) |
| 1 | 0 | 1 | Program:Write (Program/Erase) |
| 0 | 0 | 1 | Illegal State |
| 0 | 1 | 1 | Illegal State |
| 1 | 1 | 1 | Illegal State |

During the normal device state, the state machine is in state 000, the inputs, outputs and the array 455 are in a normal active state, and the array programming circuitry is inactive.

Figure 21:
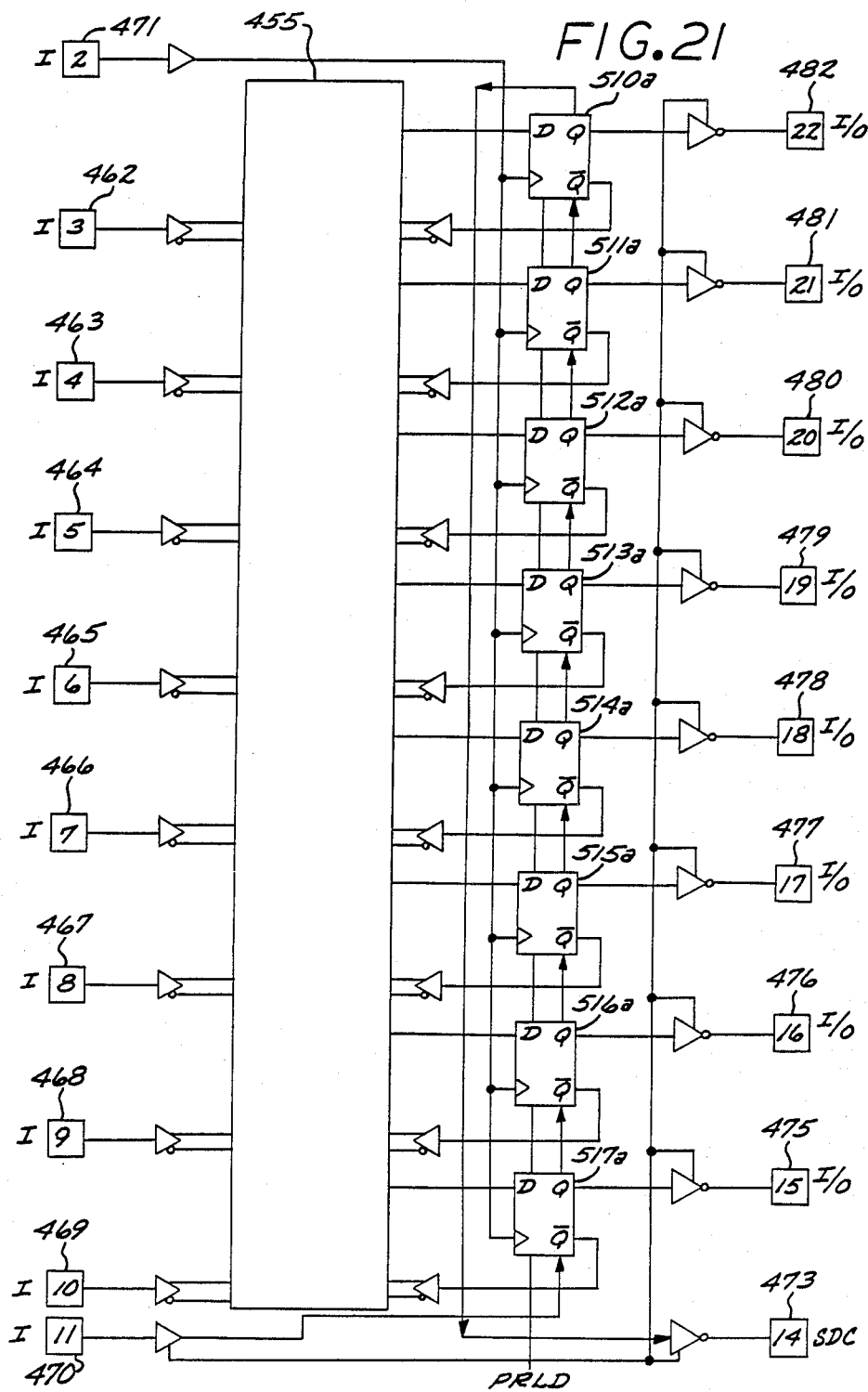
FIG. 21 is a simplified schematic illustrative of the output data registers configured for the "Diagnostic: Register Preload" state of the second embodiment.

During the "Diagnostic: Register Preload" device state, the state machine is in state 010. This state permits initialization of the data registers in the output logic macrocells 510–517. (The cells 510–517 operate in the same manner in the NORMAL state as the output cell depicted in FIG. 5 for the first embodiment; device 124g is the data register.) This eases the task of testing the registered outputs of the device by providing the capability to set the state of the internal feedback path. This makes possible external control of all 32 input lines going to the array 455, facilitating testing of the array's programmed logic connections by easily defining all inputs, a task that would otherwise be quite difficult. This state 010 is entered by raising the MODE and SDI pins to a TTL high logic level and clocking DCLK once. Then with the MODE pin at the low state, SDI pin data becomes register data and is then clocked by DCLK from the SDI buffer to the data registers in a serial fashion. FIG. 21 is a diagrammatic schematic of the interconnections of the state registers 510a-517a of the OLMCS 510–517 during the "Diagnostic: Register Preload" state.

The device outputs will latch present data upon entering the "Diagnostic: Register Preload" state 010. When the Normal device state is accessed directly after the register preload state, the outputs will become active to the new preloaded data.

In the device "Program: Shift" state, the internal state machine is in state 100. In this state, the inputs are inactive, and the programming circuitry is active. The I/O pins 475–482 are latched to their condition upon leaving the Normal state. The user may also choose to tri-state the outputs when in the "Program:Shift," "Program: Read" and "Program: Write" states under the control of the TC architectural control bit, as will be described in further detail below.

In the "Program: Read" state, the internal state machine is in the state 110, and the rest of the device is in the program configuration described above.

In the "Program: Write" state, the internal state machine is in state 101. The rest of the device is in the program configuration described above with respect to the "Program: Shift" state. The programming cycle is initiated on the leading edge of DCLK and is terminated upon the next leading edge of DCLK. The programming time is therefore directly under the control of DCLK. The write pulse is generated directly from the state machine output, and will therefore last as long as the state machine remains in the write state.

A typical "Diagnostic: Register Preload" sequence is entered from the "NORMAL" state. The external signal waveforms for the MODE, SDI, and DCLK signals for a typical sequence are illustrated in the waveform diagrams of FIGS. 26a–e. In these figures, time interval T1 represents the device normal state during which DCLK is inactive at a TTL low level, with the MODE and SDI signals at "don't care" logic levels. The "Diagnostic: Register Preload" state is entered by setting MODE and SDI to the logic high level and bringing DCLK high, the transition occurring on the rising edge of DCLK. Time interval T2 indicates the first DCLK cycle on entry into this state. The device outputs as pins 475–482 are latched to their present data state during time interval T2 to prevent loss of the output data.

During interval T2, MODE is brought to the low logic level, so that the device state remains in the "Diagnostic: Register Preload" state. Time interval T3 represents the time interval during which the output register data to be preloaded is shifted into the SDI port of the device. In this state, the multiplexer between the SDI pin 470 and the SRL sends data to the output registers in accordance with the number of registered output for which the device has been configured (FIGS. 26a–d illustrate the case wherein all eight outputs are registered.) Thus, during the eight DCLK cycles of time interval T3, bits 0–7 are serially entered at the SDI pin (FIG. 26b). If fewer outputs are registered, then only the numbers of bits for the number of registered outputs are entered. During interval T3, the device outputs remain latched to their data condition existing upon transition from the "NORMAL" state. The MODE signal is brought to the high TTL logic level and the SDI signal is brought to the low logic level after the bit 7, so that the state machine transitions back to the "NORMAL" state at time interval T4 on the next DCLK rising edge. Upon entering the "NORMAL" state, the device outputs go active to the preloaded data entered in the output registers during time interval T3.

As illustrated in FIG. 26a–e, a typical "Diagnostic: Register Preload" sequence is entered from the "NORMAL" state, and comprises the following steps:

1. MODE is TTL high, SDI is TTL high, clock DCLK to transition to the "Diagnostic: Register Preload" state, and latch the device outputs to hold their present data.
2. MODE is TTL low, SDI is output register programming data, clock DCLK to shift programming data into the configured output data registers. The SDO data field is the old output register data.
3. MODE is TTL high, SDI is TTL low, clock DCLK to transition to the "NORMAL" state. The device outputs are then set to the valid preloaded states.

A typical "read" or "write" programming sequence is entered from the NORMAL state, and is depicted in the timing waveform diagram of FIGS. 26A–E. During time interval $T_1$, the device is in the NORMAL state. The MODE, SDI and DCLK signals are then brought to the high logic level to transition to the next state, the "Diagnostic: Register Preload: state during time interval $T_2$. This state is passed through on the next DCLK rising edge by keeping MODE and SDI at the high logic level. During time interval $T_{3a}$, the device state transitions to the " Program: Shift" state. The MODE signal is brought to the low logic level so that during time interval $T_{3b}$, the state continues to transition back to the "Preload: Shift" state so that valid SDI data may be entered through the SDI pin. 82 data bits and 6 RAG bits are then shifted into the SRL during time interval $T_{3b}$. The MODE and SDI signals are then brought to the high logic level to cause a state transition to the next state on the next DCLK rising edge.

The next state is the "Program: Read" state, time interval $T_4$. The MODE and SDI signals remain at the high logic level to cause a state transion to the next state on the next DCLK rising edge.

The next state is the "Program: Write" state, time interval $T_5$, during which the memory cells are programmed in accordance with the SRL data contents. The length of time interval $T_5$, the programming write pulse, is nominally 10 milliseconds. To transition from this state to the next state, the MODE signal is brought to the low logic level, to transition to the "Program: Read" state during time interval $T_6$, the product term sense amplifiers sense the condition of the particular selected row of cells. The MODE signal remains at the low logic level to cause the state transition to the "Program: Shift" state on the next DCLK rising edge, time interval $T_{7a}$. A parallel SRL load takes place on the transition from the "Program: Read" state to "Program: Shift" state, wherein the sense amplifier conditions are latched into the SRL registers. During the "Program: Shift" state, 88 bits of new data may be shifted into the SRL, and 88 bits may be shifted out of the SDO port 473 for verification.

A typical "read" programming sequence is entered from the NORMAL state, and comprises the following steps:

1. MODE is TTL high, SDI is TTL high, Clock DCLK. Diagnostic: Register Preload State (Just passing through)
2. MODE is TTL high, SDI is TTL high, Clock DCLK. Program: Shift State.
3. MODE is TTL low, SDI is address data, Clock DCLK. Program: Shift State (Load SRL with read address data) (SDO data field is "don't care.")
4. MODE is TTL high, SDI is TTL high, Clock DCLK. Program: Read State.
5. MODE is TTL low, SDI is "don't care," Clock DCLK. Read address (execution of verify). Program: Shift State.
6. MODE is TTL low, SDI is "don't care," Clock DCLK. Program: Shift State. Shift out 82 bit data word and 6 bit address, and observe SDO.
7. Repeat steps 3–6 for each row address of verification.

A typical "write" programming cycle comprise the following steps:
1. MODE is TTL high, SDI is TTL high, Clock DCLK. Diagnostic: Register Preload state (Just passing through).
2. MODE is TTL high, SDI is TTL high, Clock DCLK. Program: Shift state.
3. MODE is TTL low, SDI is address bits/data bits, Clock DCLK. Program: Shift state. (Load SRL with 82 data bits and 6 address bits.) (SDO data field is "don't care.")
4. MODE is TTL high, SDI is TTL high, Clock DCLK. Program: Read state (Just passing through).
5. MODE is TTL High, SDI is TTL high, Clock DCLK. Program: Write state. (Write begins immediately upon entering Program: Write) (Time out write pulse).
6. MODE is TTL low, SDI is TTL high, ($\overline{HL}$, default is HH), Clock DCLK. Program: Read state.
7. MODE is TTL low, SDI is "don't care," Clock DCLK. Read Address (execution of verify; SRL is loaded) Program: Shift state.
8. MODE is TTL low, SDI is next 88 bit word, Clock DCLK. Program: Shift state. Shift out 82 bits data and 6 bits address, and observe SDO.
9. Repeat steps 4–6 for each row address of verification A further feature of the in-system programmable device 450 of FIG. 12 is the provision of means for operator selection of the state of the device outputs (pins 475–482) during one of the programming: (shift, read, write) states, in either a latched state or a tri-stated condition. The choice of the output condition will depend upon specific user systems. A default condition, the active latched state, is provided wherein the present data conditions of the device outputs upon leaving the Normal state are latched. The device 450 also provides the user with the capability of programming the device so that the outputs will tri-state (go to a high impedance condition) when in the "Program: Shift," "Program: Read," and "Program: Write" states.

To pre-condition the device to tri-state the outputs during the programming states, the tri-state control bit (TC bit) must be set. If the TC bit is not programmed in advance, a default state of "1" for the TC bit will be asserted, and the outputs will latch the last data condition present upon exiting the normal state. In the case when the TC bit is programmed to a "0," the output will tri-state (go to a high impedance condition) when transitioning to one of the programming states.

Figure 22:
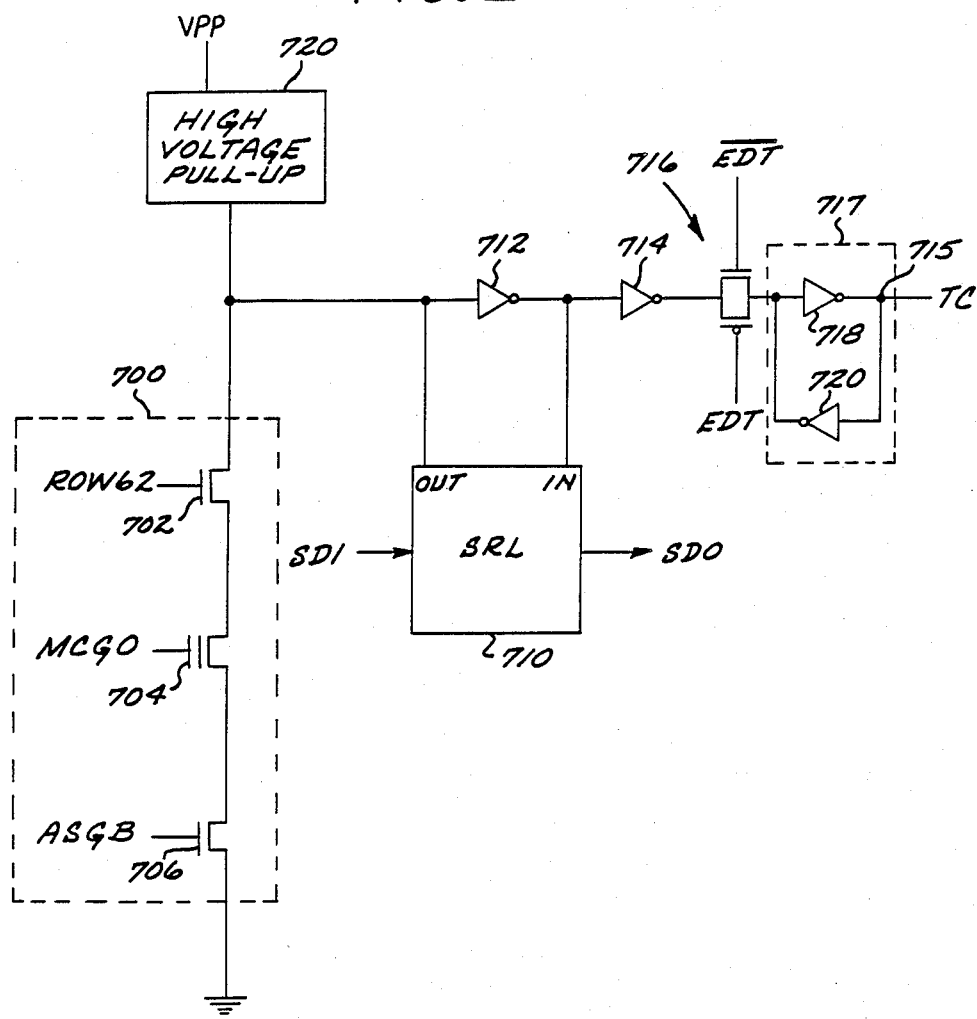
FIG. 22 is a simplified schematic diagram of an exemplary memory cell, shift register latch stage and circuitry for providing a logic signal employed to control the state of the output pins of the device of FIG. 12 during the programming mode.

The TC bit is stored in row 62 of the array 455 in this embodiment of the device 450. Referring now to FIG. 22, a simplified schematic diagram is shown of the TC bit memory cell 700 and ancillary circuitry for developing the TC bit signal. The memory cell 700 comprises select transistor 702 and the floating gate memory or sense transistor 704. The select transistor is gated by the decoded row 62 row address gate signal. The memory transistor 704 is gated by the MCGO signal, which is at ground during the programming cycle. A third transistor 706 is series coupled with the transistors 702 and 706 to ground, and is gated by the ASGB signal.

The stage 710 of the SRL 505 coupled to the column in which the TC memory cell 700 is located is depicted diagrammatically in FIG. 22, indicating the arrangement allowing data latched into the stage to be programmed into the cell 700, or conversely allowing the state of the cell 700 to read into the stage 710 for subsequent observation. The data latched in the stage is passed to the high voltage pull up circuit 720. Thus, with appropriate gating of the transistor 702 and 706, and application of the high programming voltage on the drain of the sense transistor 704 in dependence on the latched state of the SRL 710, the memory cell will either remain in the enhancement mode or be programmed to the state depletion mode, in the manner described above with respect to the embodiment of FIGS. 1–11.

The signal TC is the logic level condition at node 715 in FIG. 22. The present condition of the memory cell 700 is passed through inverters 712 and 714 to the pass gate 716. When control signals EDT and $\overline{EDT}$ are at the respective high and low logic levels (during the Normal State 000), the cell condition is passed through gate 716 and latched into the latch 717 comprising cross-coupled inverters 718 and 720.

The TC signal default state is the low state. Only when the default state is to be overridden is the cell 700 programmed to the depletion mode, so that the TC signal is set to the high state.

The latched TC signal condition at node 715 drives the control logic circuit shown in FIG. 23. The control logic circuit permits output tri-state condition data to be passed or isolated from the corresponding output buffer. The TC signal at node 715 is coupled as one input to AND gate 731, whose output drives the control gates of pass gate 728. The EDT signal is another input to the AND gate 731, and gates the TC signal condition at node 719. The TC signal also gates transistor 730, so that the output of the pass gate 728 is grounded when node 719 is at the high logic level. The output of the pass gate 728 is the TRI signal which is coupled to the output buffer (FIG. 24) and will be at a low logic level to tri-state the device output.

There are certain conditions during the Normal device operating state when the device outputs at pins 475–482 may be individually and selectively tri-stated. For example, an output may be tri-stated when used as dedicated input, when the output is registered and the $\overline{OE}$ signal (pin 474) is high, or during asynchronous I/O operation by the product term tri-state control. The selective tri-stating of the device outputs during normal operation is a conventional feature of many PLDs in use today. This Normal state output condition is represented by the logic level of the NTC signal for the particular output with each output having its own NTC signal. The default condition of the invention preserves this Normal state tri-state condition for each output.

Node 721 receives the Normal state tri-state control signal NTC, which is selectively passed through pass gate 722, gated by the $\overline{EDT}$ signal, which is active only during the Normal state. The output of the pass gate 722 is latched into the Normal tri-state condition latch 723 comprising cross-coupled inverters 724 and 726. The latch output at node 727 therefore represents the present tri-state condition during Normal state operation and is connected to the pass gate 728. Thus, the contents of the latch 723 is either isolated from the output buffer (FIG. 24) by pass gate 728, or is passed through as a logic zero to tri-state the output buffer.

FIG. 24 is a simplified schematic diagram of an exemplary one of the eight output buffers of the device. The buffer comprises means for selectively tri-stating the buffer output in response to the TRI control signal generated by the tri-state control logic (FIG. 23). The output data from the particular OLMC is presented to the output buffer at node 736 as $Q_{data}$. $Q_{data}$ is coupled to the pass gate 738, gated by the EDT and $\overline{EDT}$ signals. The pass gate output is coupled as one input to pass gate 743 and to latch 741 comprising cross-coupled inverters 742, 744. The latch output is coupled to NAND gate 746. The output of pass gate 738 is also coupled to NAND gate 748. The TRI signal is also coupled as an input to the respective NAND gates 746 and 748.

The output data signal $Q_{data}$ is latched by the output data latch 741 when leaving the Normal state to go to the "Diagnostic: Register Preload" state. The latched signal will appear at the output 758 unless the TRI signal is low (indicating the tri-state condition). With TRI low, the outputs of the NAND gates go to the high logic level, and after being inverted, the two output transistors 754 and 756 are turned off, tri-stating the output 758. Thus, the output will either be latched to the last valid data condition of $Q_{data}$ (one of the logic high, logic low or tri-stated conditions) prior to leaving the Normal state. If the TC bit is programmed, the output will be tri-stated when leaving the "Diagnostic: Register Preload" state to enter the "Program: Shift" state.

To summarize the operation of this aspect of the invention, the Normal tri-state logic signal NTC will be at the logic low condition during Normal state operation when the particular device output is active, i.e., either at the logic low or high condition, and at the logic high level when the output is tri-stated during Normal state operation. The NTC signal condition during the Normal state is passed through pass gate 722, since $\overline{EDT}$ is active, through latch 723 and pass gate 728 to the output buffer as the TRI signal. Since EDT is not active during the Normal state, the node 719 logic level is low, so that transistor 730 is non-conductive and the pass gate 728 is active. Thus, during the Normal state the TRI signal reflects the condition of the NTC signal.

Upon a transition from the Normal state, the $\overline{EDT}$ signal becomes inactive, latching the NTC data into latch 723, the EDT signal becomes active, so that the condition of the pass gate 728 and transistor 730 depend on the TC signal condition. If the TC signal is low, reflecting the default condition, then the pass gate 728 is conductive and the transistor 730 is non-conductive, so that the TRI signal reflects the condition of latch 723. Thus, the output buffer will be tri-stated if this was its condition upon transition from the Normal state. If the NTC signal is low, the output is not tri-stated and the output 758 condition is that of the output data latch 741. If the TC signal is high, reflecting the user TC bit programmed state, then the pass gate 728 is non-conductive, transistor 730 is conductive, and TRI is driven to the low logic level, tri-stating the output 758 in FIG. 24. When the device state transitions to the Normal state, the EDT signal is inactive, driving node 719 to the logic low level, so that the TRI signal resumes its latched condition.

FIGS. 28a–e are signal waveforms illustrating a typical tri-state control bit programming sequence. During time interval $T_1$, the device is in the Normal state, with DCLK at the low logic level, and the MODE and SDI signals at "don't care" levels. To transition to the next state, the MODE, SDI and DCLK signals are brought to the logic high state. On the rising edge of DCLK, the device state transitions to the "Diagnostic: Register Preload" state. During time interval $T_2$ the device outputs hold their respective data conditions which were present on the transition from the Normal state.

The next device state is the "Program: Shift" state which is entered at the commencement of time interval $T_3$ by bringing the MODE signal to the high logic level. The outputs continue to hold their present data conditions in this state. Once in the "Program:Shift" state, the MODE signal is brought to the low logic level and the state cycles within the "Program: Shift" state during interval $T_{3a}$ to shift in one TC bit and six RAG bits to select row 62, a total of seven bits. The MODE and SDI signals are then brought to the high logic level to transition to the next state.

The next device state is the "Program: Read" state (time interval $T_4$). During this interval, the MODE signal remains at the high logic level, with the SDI signal remaining at the high level, to transition to the next state on the rising edge of DCLK. The next state is the "Program: Write" state; during time interval $T_5$ the TC bit memory cell is programmed in accordance with the data condition of the TC bit. On the next rising edge of DCLK, with MODE at the low state, the device state transitions to the next state, the "Program: Read" state. During this state, time interval $T_6$, a read operation is performed, wherein the data condition of the memory cell in row 62 is latched into the corresponding stage of the SRL.

With MODE at the low level, the device transitions to the next state on the rising edge of DCLK. The next state time interval $T_7$, is the "Program: Shift" state, wherein 81 bits of "don't care" data and 7 bits of data to be verified are shifted out of the device SDO port for verification. The MODE signal is thereupon raised to the high level, with SDI at the low level, to transition to the Normal state, time interval $T_8$. At time interval $T_9$, the "Diagnostic: Register Preload" condition is entered with the outputs latched to their last solid data condition. At time interval $T_{10}$, the device state transitions to the "Program: Shift" state, whereupon the outputs will assume the tri-stated condition.

It is understood that the above-described embodiment is merely illustrative of the possible specific embodiments which can represent principles of the present invention. Other arrangements may be devised in accordance with these principles by those skilled in the art without departing from the scope of the invention.

What is claimed is:

1. An integrated in-system programmable logic device, operable during a normal device operating state to receive logical input data and provide output data in dependence on predetermined logic functions implemented by selective connection of input lines to product term lines, comprising:
   a set of device terminals dedicated to the functions of receiving input logical data signals or providing output logical data signals;
   a programmable array including at least one input line and at least one output line,
   means for coupling an input line to one of said device terminals;
   said programmable array comprising an array of one or more nonvolatile memory cells arranged in at least one row and column, each cell associated with a predetermined one of said input and output lines and arranged to selectively connect the input line to the output line in dependence on the cell state, each cell comprising a cell selection element and an electrically erasable and reprogrammable nonvolatile memory element which retains a selected cell state upon interruption of device power;

a first device utility terminal dedicated for device utility functions, including inputting serial data;

a second device utility terminal dedicated for receiving control signals to select between the normal device operating state and one or more device utility states;

a serial data receiving and transitting means coupled to the first device utility terminal for receiving serial data during a device utility state;

means for programming the cells of said array to predetermined conditions in dependence on cell selection and programming data input to the serial data receiving and transmitting means during a predetermined one of said utility states;

a third device utility terminal dedicated for device utility functions, including outputting serial data; and a fourth device utility terminal dedicated for inputting a clock signal to clock said device utility functions including clocking serial data into and out of the serial data receiving and transmitting means via the first and third device utility terminals.

2. An integrated in-system programmable logic device, operable during a normal device operating state to receive logical input signals and provide output signals in dependence on predetermined logic functions of said input signals, comprising:

a set of device terminals dedicated to the function of receiving input logical data or providing output logical data;

a programmable array including a plurality of input lines, a plurality of product term lines defining output lines;

means for coupling at least one of said input lines to one of said device terminals;

said programmable array comprising an array of one or more nonvolatile memory cells arranged for programmable interconnection of logic paths between the input lines and output lines, each cell comprising an electrically erasable and reprogrammable nonvolatile memory element which retains a selected conductive or nonconductive cell state defining a logical signal path connectivity upon interruption of device power;

a first device utility terminal dedicated for device utility functions, including inputting serial data;

a second device utility terminal dedicated for receiving an externally supplied state control signal to select between the normal device operating state and at least one device utility state, including a programming state;

data receiving means for receiving logic path programming data through the first device utility terminal during a device utility state;

means for programming said memory elements of said array to predetermined conductive or nonconductive states in dependence on said logic path programming data during said programming state to achieve a desired device logic configuration representing said predetermined logic functions;

a third device utility terminal dedicated for device utility functions, including outputting serial data;

a fourth device utility terminal dedicated for inputting a clock signal to clock said device utility functions including clocking data into the data receiving means; and means responsive to said externally supplied state control signal received through said second utility terminal for selecting between said normal device state and said device utility state.

3. A programmable logic device according to claim 1 in which the coupling means includes programmable means for selectively coupling one of the input lines to one of the device terminals.

4. A programmable logic device according to claim 2 in which the coupling means includes programmable means for selectively coupling one of the input lines to one of the device terminals.

* * * * *